(12) United States Patent
Singer et al.

(10) Patent No.: US 7,329,886 B2
(45) Date of Patent: *Feb. 12, 2008

(54) EUV ILLUMINATION SYSTEM HAVING A PLURALITY OF LIGHT SOURCES FOR ILLUMINATING AN OPTICAL ELEMENT

(75) Inventors: Wolfgang Singer, Aalen (DE); Martin Antoni, Aalen (DE); Nils Dieckmann, Hüttlingen (DE); Dirk Rothweiler, Bangkkok (TH); Jörg Schultz, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 77 days.

This patent is subject to a terminal disclaimer.

(21) Appl. No.: 10/755,846

(22) Filed: Jan. 12, 2004

(65) Prior Publication Data

US 2004/0256575 A1 Dec. 23, 2004

Related U.S. Application Data

(63) Continuation-in-part of application No. 10/429,927, filed on May 5, 2003, now Pat. No. 7,071,476, and a continuation-in-part of application No. 10/201,652, filed on Jul. 22, 2002, now Pat. No. 6,859,328, which is a continuation-in-part of application No. 10/150,650, filed on May 17, 2002, now Pat. No. 7,006,595, and a continuation-in-part of application No. 09/679,718, filed on Sep. 29, 2000, now Pat. No. 6,438,199, and a continuation of application No. 09/627,559, filed on Jul. 27, 2000, now Pat. No. 6,570,168, and a continuation-in-part of application No. 09/305,017, filed on May 4, 1999, now Pat. No. 6,198,793.

(30) Foreign Application Priority Data

| May 5, 1998 | (DE) | ................................. 198 19 898 |
| Feb. 2, 1999 | (DE) | ................................. 199 03 807 |
| Feb. 8, 1999 | (DE) | ........................... 299 02 108 U |
| Jul. 30, 1999 | (DE) | ................................. 199 35 404 |
| Jul. 28, 2000 | (WO) | ...................... PCT/EP00/07258 |

(51) Int. Cl.
*G21K 5/04* (2006.01)

(52) U.S. Cl. .............................. 250/493.1; 250/504 R; 378/34; 378/145

(58) Field of Classification Search .................... None
See application file for complete search history.

(56) References Cited

U.S. PATENT DOCUMENTS 2,748,006 A 5/1956 Kreidl et al.

(Continued)

FOREIGN PATENT DOCUMENTS

| DE | 973 350 | 1/1960 |
| DE | 196 50 692 A1 | 6/1998 |

(Continued)

OTHER PUBLICATIONS

EO 00115730.4-2222, European Search Report, dated Jan. 19, 2005.
Marc A. Klosner and William T. Silfvast, "High-temperature lithium metal-vapor capillary discharge extreme-ultraviolet source at 13,5 nm" in Applied Optics, vol. 39, No. 21, Jul. 20, 2000, pp. 3678-3682.

(Continued)

*Primary Examiner*—David Vanore
(74) *Attorney, Agent, or Firm*—Ohlandt, Greeley, Ruggiero & Perle, L.L.P.

(57) ABSTRACT

There is provided an illumination system. The illumination system includes a first light source and a second light source, each of which are for providing light having a wavelength ≦193 nm, and an optical element. The first light source illuminates a first area of the optical element and the second light source illuminates a second area of the optical element.

41 Claims, 18 Drawing Sheets

U.S. PATENT DOCUMENTS

| | | | |
|---|---|---|---|
| 4,195,913 A | 4/1980 | Dourte et al. .................. 350/292 |
| 4,294,538 A | 10/1981 | Ban ............................ 355/51 |
| 4,389,115 A | 6/1983 | Richter ........................ 355/26 |
| 4,651,012 A | 3/1987 | Clark et al. .................. 250/505.1 |
| 4,688,932 A | 8/1987 | Suzuki |
| 4,740,276 A | 4/1988 | Marmo et al. .................. 204/7 |
| 5,071,240 A | 12/1991 | Ichihara et al. |
| 5,148,442 A | 9/1992 | O'Neil et al. .................. 372/71 |
| 5,222,112 A | 6/1993 | Terasawa et al. .............. 378/34 |
| 5,339,346 A | 8/1994 | White .......................... 378/34 |
| 5,353,322 A | 10/1994 | Bruning et al. ................ 378/34 |
| 5,361,292 A | 11/1994 | Sweatt ......................... 378/34 |
| 5,402,267 A | 3/1995 | Fürter et al. .................. 359/727 |
| 5,439,781 A | 8/1995 | MacDowell et al. ......... 460/311 |
| 5,440,423 A | 8/1995 | Ogura .......................... 359/365 |
| 5,459,547 A | 10/1995 | Shiozawa |
| 5,512,759 A | 4/1996 | Sweatt ...................... 250/492.1 |
| 5,581,605 A | 12/1996 | Murakami et al. ............. 378/84 |
| 5,594,526 A | 1/1997 | Mori et al. |
| 5,644,383 A | 7/1997 | Mori |
| 5,647,664 A | 7/1997 | Hanečka ...................... 362/308 |
| 5,669,708 A | 9/1997 | Mashima et al. ............ 362/341 |
| 5,677,939 A | 10/1997 | Oshino ......................... 378/34 |
| 5,715,084 A | 2/1998 | Takahashi et al. |
| 5,737,137 A | 4/1998 | Cohen et al. .................. 359/859 |
| 5,755,503 A | 5/1998 | Chen et al. ................... 353/38 |
| 5,796,524 A | 8/1998 | Oómura |
| 5,805,356 A | 9/1998 | Chiba |
| 5,815,248 A | 9/1998 | Nishi et al. |
| 5,896,438 A | 4/1999 | Miyake et al. ................. 378/34 |
| 5,963,305 A | 10/1999 | Mizouchi |
| 5,993,010 A | 11/1999 | Ohzawa et al. ................ 353/99 |
| 5,995,582 A | 11/1999 | Terashima et al. ............. 378/34 |
| 6,038,279 A * | 3/2000 | Miyake et al. ................. 378/34 |
| 6,057,899 A | 5/2000 | Tanaka et al. |
| 6,064,072 A | 5/2000 | Partlo et al. ............. 250/504 R |
| 6,081,319 A | 6/2000 | Ozawa et al. |
| 6,084,655 A | 7/2000 | Suzuki et al. |
| 6,195,201 B1 | 2/2001 | Koch et al. .................. 359/366 |
| 6,198,793 B1 | 3/2001 | Schultz et al. |
| 6,208,707 B1 | 3/2001 | Oshino |
| 6,229,647 B1 | 5/2001 | Takahashi et al. |
| 6,233,039 B1 | 5/2001 | Yen et al. |
| 6,236,449 B1 | 5/2001 | Tanitsu |
| 6,259,512 B1 | 7/2001 | Mizouchi |
| 6,266,389 B1 | 7/2001 | Murayama et al. |
| 6,268,904 B1 | 7/2001 | Mori et al. |
| 6,310,679 B1 | 10/2001 | Shiraishi |
| 6,325,514 B1 | 12/2001 | Yamamoto |
| 6,335,786 B1 | 1/2002 | Shiraishi |
| 6,339,467 B1 | 1/2002 | Sato |
| 6,353,470 B1 | 3/2002 | Dinger ........................ 355/71 |
| 6,396,068 B1 | 5/2002 | Sweatt et al. ........... 250/504 R |
| 6,400,794 B1 | 6/2002 | Schultz et al. |
| 6,438,199 B1 * | 8/2002 | Schultz et al. ................ 378/34 |
| 6,507,440 B1 | 1/2003 | Schultz |
| 6,545,272 B1 | 4/2003 | Kondo |
| 6,563,567 B1 | 5/2003 | Komatsuda et al. |
| 6,570,168 B1 * | 5/2003 | Schultz et al. ........... 250/492.2 |
| 6,573,978 B1 | 6/2003 | McGuire, Jr. |
| 6,583,937 B1 | 6/2003 | Wangler et al. |
| 6,594,334 B1 | 7/2003 | Ota |
| RE38,438 E | 2/2004 | Takahashi |
| 2001/0030740 A1 | 10/2001 | Mori et al. |
| 2002/0009178 A1 | 1/2002 | Dinger et al. |
| 2002/0041368 A1 | 4/2002 | Ota et al. |
| 2002/0186811 A1 | 12/2002 | Weiss et al. .................. 378/34 |
| 2003/0043455 A1 | 3/2003 | Singer et al. ............... 359/357 |
| 2003/0095623 A1 | 5/2003 | Singer et al. ................. 378/34 |

FOREIGN PATENT DOCUMENTS

| | | |
|---|---|---|
| EP | 0066295 A1 | 12/1982 |
| EP | 0359018 A2 | 3/1990 |
| EP | 0939341 A2 | 9/1999 |
| EP | 0 955 641 | 11/1999 |
| EP | 1072957 | 7/2000 |
| EP | 1026547 A2 | 8/2000 |
| EP | 1067437 | 1/2001 |
| EP | 1434240 A1 | 6/2004 |
| GB | 2 320 023 A | 6/1998 |
| JP | 403111806 A | 5/1991 |
| JP | 05045605 | 2/1993 |
| JP | 406265887 A | 9/1994 |
| JP | 11044920 A | 2/1999 |
| WO | WO99/57732 | 11/1999 |

OTHER PUBLICATIONS

M.A. Klosner et al., Applied Optics vol. 40, p. 4849-4851 (2001).
Hynn-Joon Shin, Dong-Eon Kim, Tong-Nyong Jee, "Soft X-Ray amplification in a capillary discharge" in Physical Review E, vol. 50, No. 2 (1994), pp. 1376-1382.
Murphy et al., "Synchrotron Radiation Sources and Condensers for Projection X-Ray Lithography", Applied Optics, vol. 32, No. 34, pp. 6920-6929 (Dec. 1, 1993).
"Handbook on Synchrotron Radiation", Ernst-Echard Koch ed., pp. 140-145, 1098-1111 (1983).
"The Optics of Spectroscopy", Section 3: "Spectrometer Throughout and Etendue", downloaded from the internet Website: wysiwyg://18/httpwww.jyhoriba.co.uk/jy/oos/oos_ch3.htm.
W T. Welford Optics, Third Edition (pp. 30-31) Oxford Science Publications; Oxford University Press, 1988.

* cited by examiner

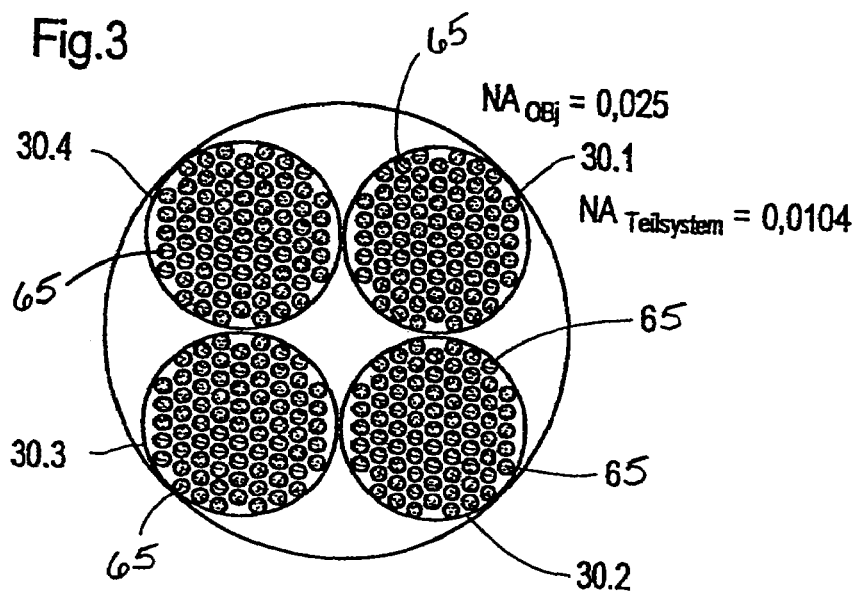
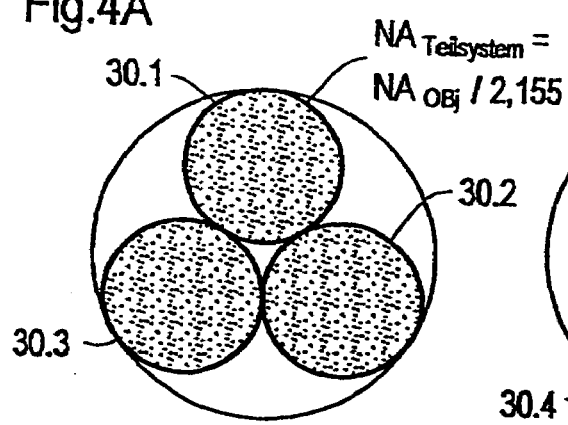
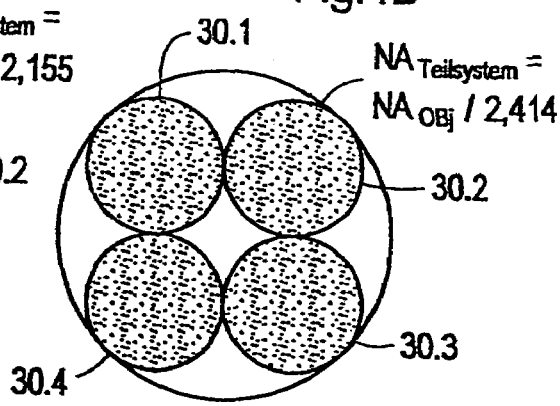
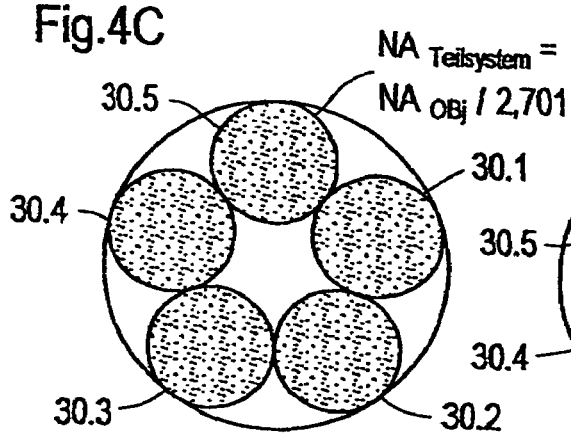
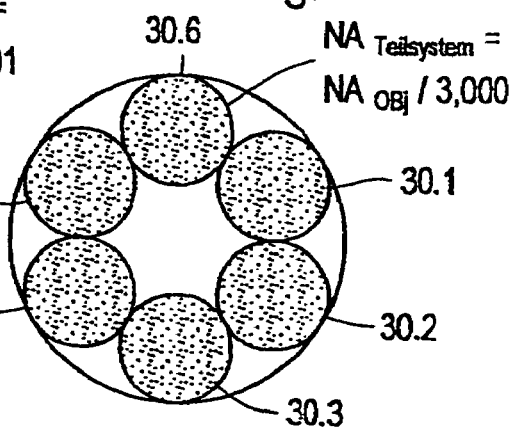

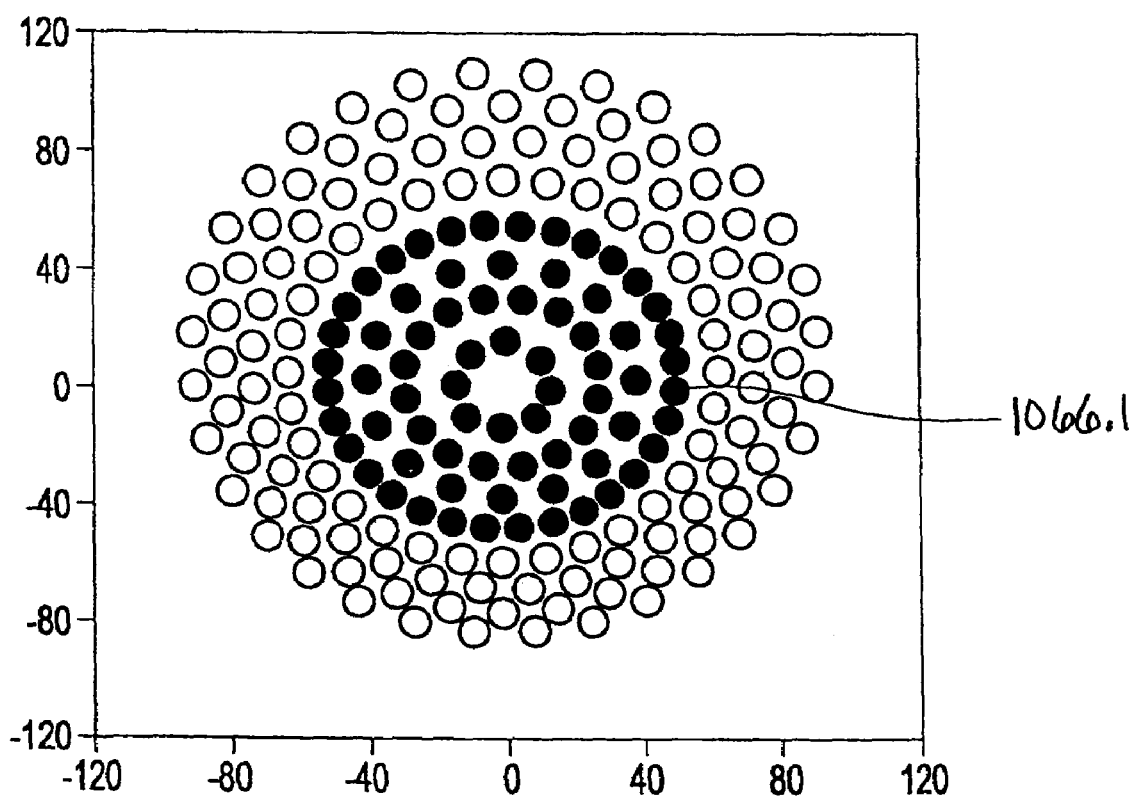
Fig. 16.1

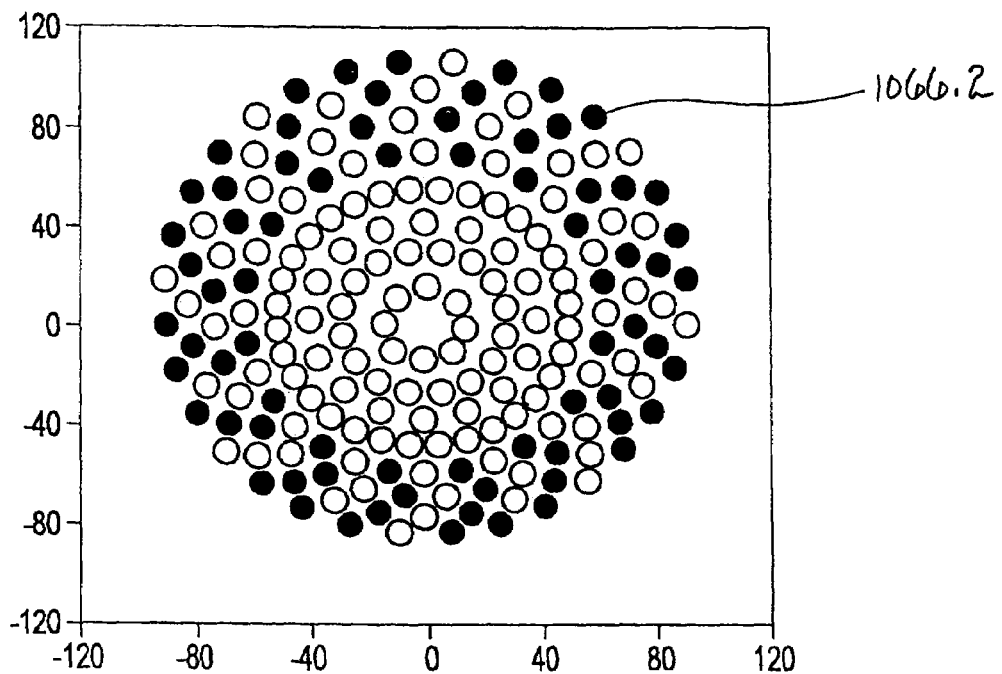
Fig. 16.2
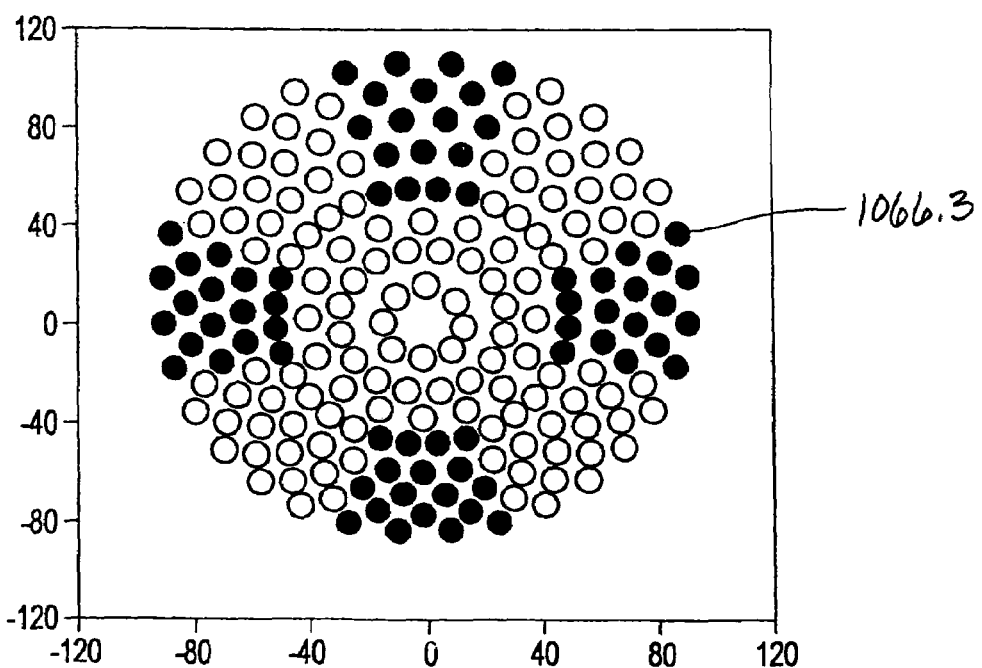
Fig. 16.3

Fig 19 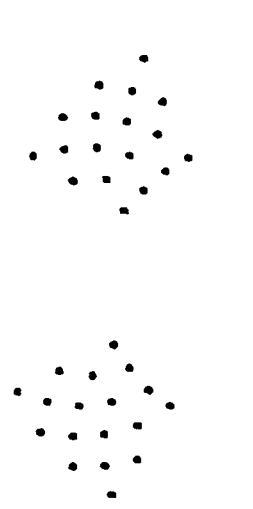 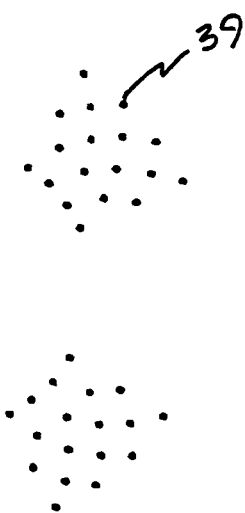

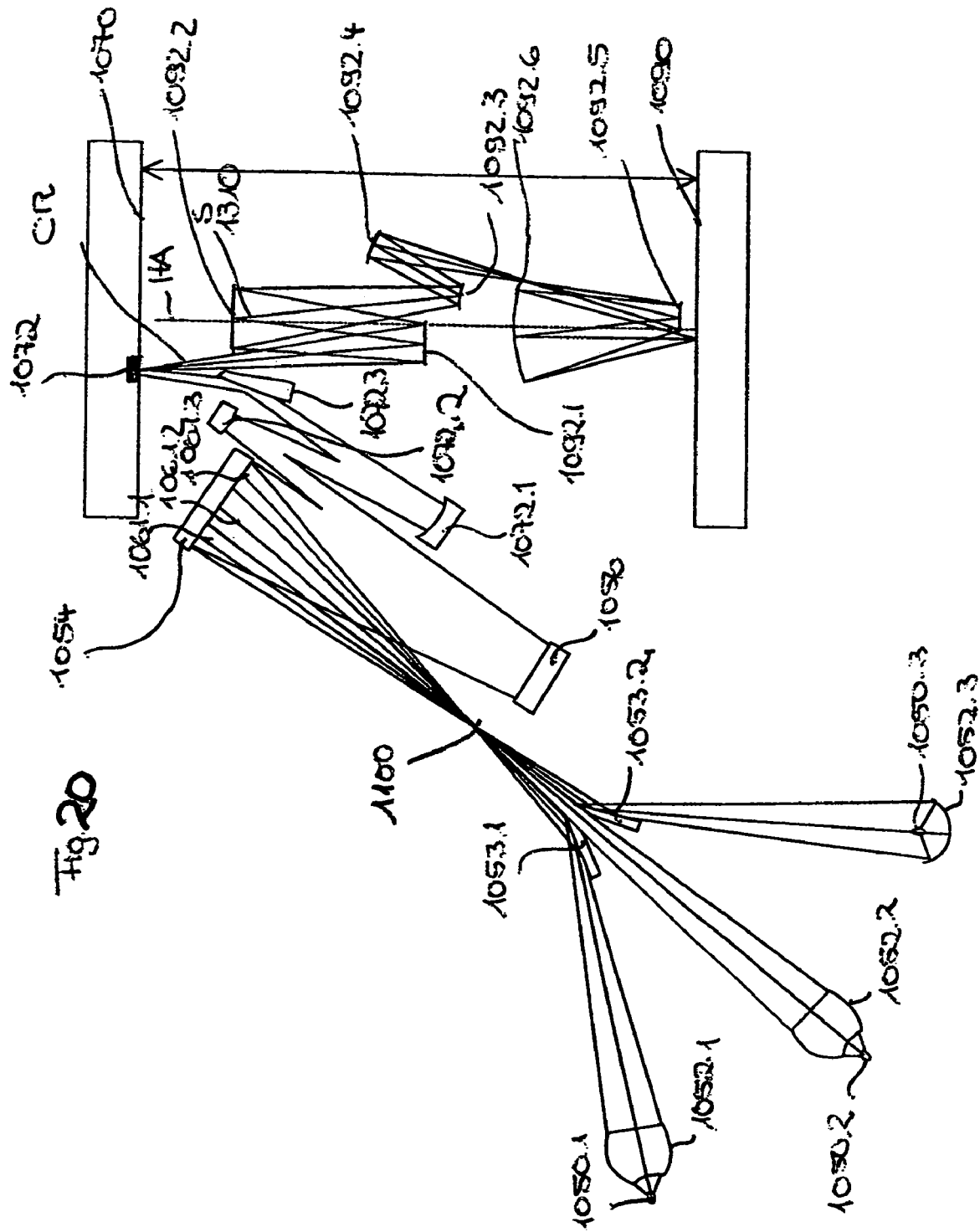

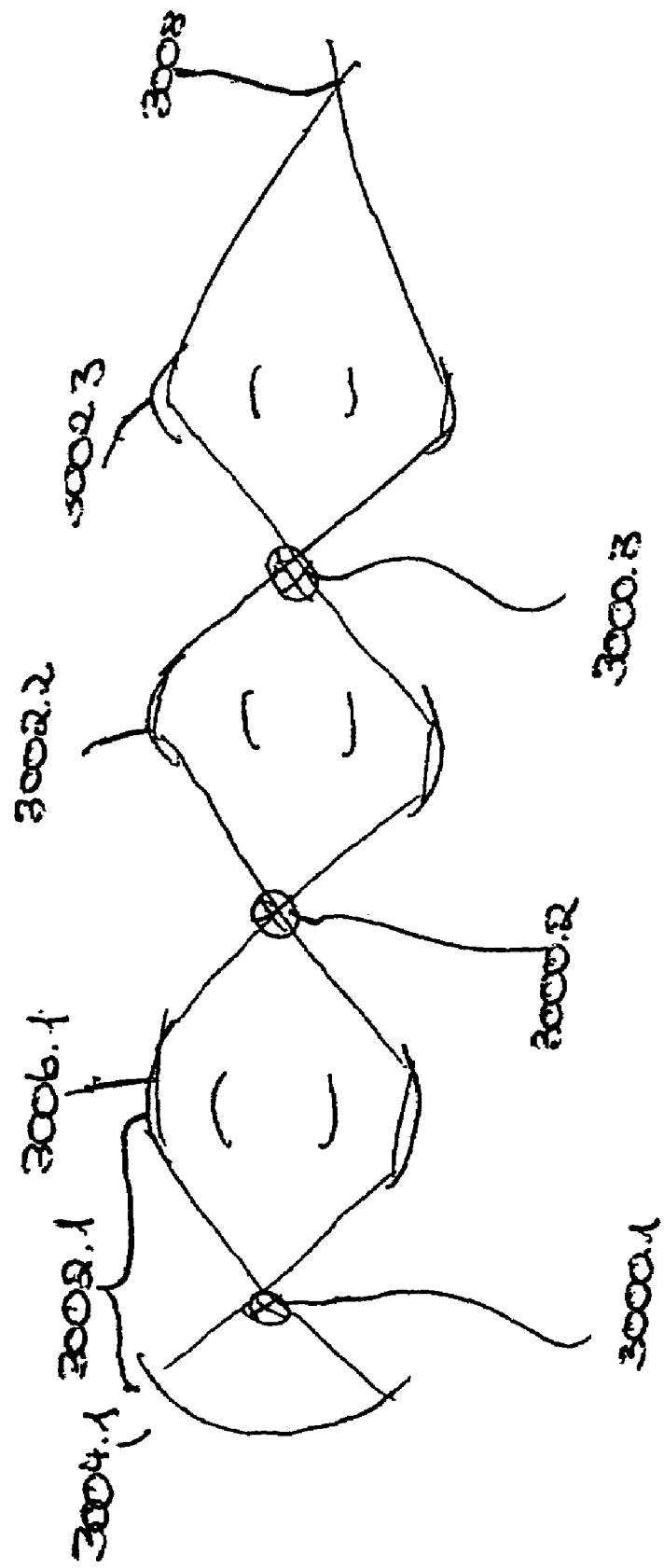

EUV ILLUMINATION SYSTEM HAVING A PLURALITY OF LIGHT SOURCES FOR ILLUMINATING AN OPTICAL ELEMENT

CROSS-REFERENCE TO RELATED APPLICATIONS

The present application is (a) a continuation-in-part of U.S. patent application Ser. No. 10/429,927, and (b) a continuation-in-part of U.S. patent application Ser. No. 10/201,652. The Ser. No. 10/429,927 was filed May 5, 2003, now U.S. Pat. No. 7,071,476, and is (a) a continuation of U.S. patent application Ser. No. 09/627,559, and (b) a continuation-in-part of U.S. patent application Ser. No. 10/201,652. The Ser. No. 09/627,559 application was filed Jul. 27, 2000, and issued as U.S. Pat. No. 6,570,168. The Ser. No. 10/201,652 application was filed Jul. 22, 2002, now U.S. Pat. No. 6,859,328, and is (a) a continuation-in-part of U.S. patent application Ser. No. 10/150,650, and (b) a continuation-in-part of U.S. patent application Ser. No. 09/679,718. The Ser. No. 10/150,650 application was filed May 17, 2002, now U.S. Pat. No. 7,006,595, and is a continuation-in-part of the Ser. No. 09/679,718 application. The Ser. No. 09/679,718 application was filed Sep. 29, 2000, issued as U.S. Pat. No. 6,438,199, and is a continuation-in-part of U.S. patent application Ser. No. 09/305,017. The Ser. No. 09/305,017 application was filed May 4, 1999, and issued as U.S. Pat. No. 6,198,793. The present application is also claiming priority of (a) International Application No. PCT/EP00/07258, filed Jul. 28, 2000, (b) German Patent Application No. 299 02 108, filed Feb. 8, 1999, (c) German Patent Application No. 199 03 807, filed Feb. 2, 1999, (d) German Patent Application No. 198 19 898, filed May 5, 1998, and (e) German Patent Application No. 199 35 404.9, filed Jul. 30, 1999.

BACKGROUND OF THE INVENTION

1. Field of the Invention

The invention concerns an illumination system for wavelengths $\leq 193$ nanometers (nm), and more particularly, an illumination system for vacuum ultraviolet (VUV)-lithography or extreme ultraviolet (EUV)-lithography.

2. Description of the Related Art

In order to allow even further reduction in structural width of electronic components, especially to the submicron range, it is necessary to reduce the wavelength of the light used in microlithography.

For wavelengths smaller than 193 nm, lithography with weak x-rays or so-called EUV-lithography is discussed.

A suitable illumination system for EUV-lithography should homogeneously or uniformly illuminate, with as few reflections as possible, a pregiven field, especially an annular field of an objective lens, under lithography requirements. Furthermore a pupil of the objective lens should be illuminated up to a particular degree of filling σ, independently of the field, and an exit pupil of the illumination system should be situated in an entrance pupil of the objective lens.

Regarding the basic layout of EUV-illumination systems, we refer to European Patent Application No. EP 99 106348.8, submitted on Mar. 2, 1999, entitled "Illumination system, especially for EUV-lithography", U.S. patent application Ser. No. 09/305,017, submitted on May 4, 1999 entitled "Illumination system particularly for EUV-lithography", and International Patent Application No. PCT/EP 99/02999, submitted on May 4, 1999, entitled "Illumination system, especially for EUV-lithography", the disclosure contents of which are incorporated in their entirety in the present application.

The following are discussed herein as light sources for EUV-illumination systems:
Laser plasma sources
pinch plasma sources
capillary discharge sources
synchrotron radiation sources In the case of Laser plasma sources, an intensive Laser beam is focused onto a target (solid, gas jet, droplet). The target is heated so strongly by the excitation that a plasma is formed. This emits EUV-radiation.

Typical Laser plasma sources have a spherical beam, i.e., a radiation angle of $4\pi$, as well as a diameter of 50 micrometers (μm) to 200 μm.

In pinch plasma sources, the plasma is produced by means of electrical excitation.

Pinch plasma sources can be described as volume radiators (D=1.00 millimeters (mm)), which emit in $4\pi$, whereby a beam characteristic is dictated by source geometry.

Capillary discharge sources are pinch plasma sources, where a discharge plasma is produced inside of a capillary; such sources emit only into a small angular cone. Such a source is disclosed, for example, in Marc A. Klosner and William T. Silfvast, "High-temperature lithium metal-vapor capillary discharge extreme-ultraviolet source at 13.5 nm" in Applied Optics, Vol. 39, No. 21, Jul. 20, 2000, pp. 3678-3682 and Hynn-Joon Shin, Dong-Eon Kim, Tong-Nyong Jee, "Soft X-Ray amplification in a capillary discharge" in Physical Review E, Vol. 50, No. 2 (1994), pp. 1376-1382. The disclosure content of these articles is incorporated herein by reference to the full extent.

In the case of synchrotron radiation sources, one can distinguish three types of sources at present:
bending magnets
wigglers
undulators In bending magnet sources, the electrons are deflected by a bending magnet and emit photon radiation.

Wiggler sources comprise a so-called wiggler for deflection of an electron or an electron beam. This wiggler comprises a multiple number of alternating polarized pairs of magnets arranged in rows. If an electron passes through a wiggler, it is subjected to a periodic, vertical magnetic field and the electron oscillates in a horizontal plane. Wigglers are also characterized by the fact that no coherency effects occur. The synchrotron radiation produced by a wiggler is similar to a bending magnet and radiates in a horizontal solid angle. In contrast to the bending magnet, it has a flux that is intensified by the number of poles of the wiggler.

There is no clear dividing line between wiggler sources and undulator sources.

In an undulator source, electrons are subjected to a magnetic field of shorter period and smaller magnetic field of the deflection poles than in the case of a wiggler, so that interference effects occur in the synchrotron radiation. The synchrotron radiation has a discontinuous spectrum based on the interference effects and emits both horizontally as well as vertically in a small solid-angle element; i.e., the radiation is highly directional.

It is critical for an EUV-illumination system to provide a sufficiently high Lagrange optical invariant or etendue, also called geometrical flux. The Lagrange optical invariant of a system is defined as a product of an illuminated surface and an area of an aperture.

If a numerical aperture in a plane of a wafer is in the range $NA_{wafer}=0.1$-$0.25$, then in the case of 4:1 systems, a numerical aperture of $NA_{reticle}=0.025$-$0.0625$ is needed in a reticle plane. If the illumination system is supposed to illuminate this aperture homogeneously and independent from the field up to a filling degree of $\sigma=0.6$, for example, the EUV-source must have the following 2-dim Lagrange optical invariant or etendue: (LC).

$$LC_{ill.}=\sigma^2 LC_{Obj}=0.467 \text{ mm}^2\text{-}2.916 \text{ mm}^2$$

The Lagrange optical invariant LC, is generally defined as follows for the lithography system described herein:
$LC_{ill.}=\sigma^2 x \cdot y \cdot \pi \cdot NA^2=\sigma^2 A \cdot \pi \cdot NA^2$, wherein A is the illuminated area. The area comprises 110 mm×6 mm, for example, in the reticle plane.

The Etendue of a Laser plasma source can be defined as the product of an illuminated surface of an imaginary unit sphere around a source and a square of a Numerical Aperture at which each field point of the imaginary unit source sees the spherical source.

$$LC=A \cdot \pi \cdot NA^2$$

$$A^{LPQ}=2\pi[\cos(\theta_1)-\cos(\theta_2)]\times(R_{sphere})^2, \text{ with } R_{sphere}=1 \text{ mm}$$

$$NA \approx r^{LPQ}/R_{sphere}=0.100$$

where $\theta_1$ is a minimum beam angle with respect to an optical axis and $\theta_2$ is a maximum beam angle with respect to the optical axis $$LC_{LPQ}=2\pi[\cos(\theta_1)-\cos(\theta_2)] \cdot \pi \cdot r^2_{LPQ}$$

With typical source parameters:
1. $r_{LPQ}=0.1$ mm, $\theta_1=0°$, $\theta_2=90°$ yields: $LC_{LPQ}=0.198$ mm². This corresponds to 42% of the required value of the Lagrange optical invariant $LC_{ill}$ of, for example, 0.467 mm².
2. $r_{LPQ}=0.025$ mm, $_1\theta_1=0°$, $\theta_2=90°$ yields: $LC_{LPQ}=0.0123$ mm². This corresponds to 2.6% of the required value of the Lagrange optical invariant of, for example, $LC_{ill}=0.467$ mm².

The Lagrange optical invariant $LC_{Pinch}$ of a pinch plasma source with a diameter of 1 mm, $\Omega=0.3$ sr, for example, is:

$$LC_{Pinch}=A \cdot \pi \cdot NA^2=(\pi \cdot 1 \text{ mm}^2/4) \cdot \pi \cdot 0.30532^2=0.229 \text{ mm}^2.$$

Thus, the pinch plasma source provides 49% of the required value of the Lagrange optical invariant of, for example, $LC_{ill}=0.467$ mm².

The Lagrange optical invariant or Etendue for the undulator source can be estimated by a simplified model assuming a homogeneous two-dimensional radiator with diameter $\varnothing=1.0$ mm and aperture $NA_{Und}=0.001$ with
$LC_{Und}=A \cdot \pi \cdot NA^2$
$A_{Und}=\pi \cdot (\varnothing/2)^2$
$=0.785$ mm²
$NA_{Und}=0.001$
as
$LC_{Und}=A \cdot \pi \cdot NA^2=2.5\text{E-}6$ mm².

As can be seen from this rough calculation, the Etendue or Lagrange optical invariant of the undulator source is much too small in comparison to the required value of the Lagrange optical invariant.

To increase the Lagrange optical invariant, an illumination system comprising a synchrotron radiation source known from U.S. Pat. No. 5,512,759, comprises a condenser system with a plurality of collecting mirrors, which collect the radiation emitted by the synchrotron radiation source and form it to an annular light beam that corresponds to an annular field being illuminated. By this, the annular field is illuminated very uniformly. The synchrotron radiation source has a beam divergence>100 millirad (mrad) in a plane of radiation.

U.S. Pat. No. 5,439,781 shows an illumination system with a synchrotron radiation source in which the Lagrange optical invariant, is adjusted by means of a scattering plate in an entrance pupil of an objective lens, wherein the scattering plate can comprise a plurality of pyramidal structures. Also, in U.S. Pat. No. 5,439,781, the synchrotron radiation source has a beam divergence>100 mrad. The synchrotron radiation according to U.S. Pat. No. 5,439,781 is also focused, for example, by means of a collector mirror.

The disclosure contents of both of the above-mentioned documents
    U.S. Pat. No. 5,512,759
    U.S. Pat. No. 5,439,781
are incorporated into the disclosure contents of the present application by reference.

SUMMARY OF THE INVENTION

The object of the invention is to supply an illumination system of easy construction having the required Etendue in an object plane or a reticle plane.

The object of the invention is solved in that several light sources are coupled in order to illuminate an exit pupil of the illumination system.

The coupling of several light sources also results in an increase of intensity. The coupling of several light sources is possible as long as a total Lagrange optical invariant of all coupled sources is less or only slightly larger than the Lagrange optical invariant of the illumination system $LC_{ill}$.

There are three basic possibilities for coupling:
1. Addition method: Identical or similar illumination systems are distributed about an axis of the system. The exit pupil of the illumination system is illuminated by a plurality of secondary light source images of arbitrary shapes, which must not overlap. Partial pupils are located on a side face of a polyhedron input mirror that superimposes light bundles on the object plane or reticle plane.
2. Mixing method: In this case, each system part illuminates the entire exit pupil of the illumination system, but with regions free of light between secondary light sources. Individual grids of the secondary light sources are staggered by superimposing, so as to uniformly fill the exit pupil. A coupling mirror includes a raster element plate, whose raster elements or facets have the shape of pyramids or, in general, of polyhedron elements. Each side face of an individual raster element of the polyhedron element is illuminated by a secondary light source.
3. Segment method: Similar to the addition method, but unlike the addition method, a segment of any desired shape is illuminated by appropriate beam deflection, instead of a circular segment of the exit pupil.

In a preferred embodiment of the invention, the illumination system comprises a first optical element with a plurality of first raster elements. Each of the plurality of light sources of the illumination system illuminates a different area of the first optical element. The first raster elements are also called field raster elements. The different areas illuminated by the plurality of light sources can overlap. If different areas of the first optical element are illuminated, spatial multiplexing of light sources is possible.

Each of the field raster elements creates a secondary light source in a plane conjugated to a plane of the exit pupil of the illumination system. The distribution of the secondary light sources images within the plane gives a specific illumination setting of the illumination system in the exit pupil.

According to a preferred embodiment of the invention, light impinging onto a first raster element is deflected by the first raster element in such a way, that a specific spatial distribution of secondary light sources corresponding to a specific illumination setting is achieved in an exit plane. Light from different areas associated to different sources can contribute to such an illumination setting. An advantage of such an embodiment is that a plurality of light sources can be coupled in the exit plane of the illumination system up to an etendue limit of the illumination system. By coupling a plurality of light sources, light intensity in the field plane and thus, throughput of the lithographic apparatus, can be enhanced. In such an embodiment the first optical element having a plurality of raster elements has to be adapted to the different light sources and the illumination setting in the exit pupil in such a way that tilt angles of a plurality of raster elements are adjusted to reflect light from one of the plurality of light sources to a plurality of secondary light sources in a pupil plane.

In another embodiment each area illuminated on the first optical element for each light source is associated to a different specific illumination setting in the exit plane of the illumination system. In such an embodiment by turning different light sources on, or switching them off, the illumination setting in the exit plane can easily changed without moving any optical components. For example, a first plurality of light sources can illuminate the secondary light sources in a centre of the pupil, while a second plurality of light sources is assigned by the tilt angles of corresponding raster elements to form the secondary light sources of outer rings of the pupil. Thus, by switching off the first plurality of light sources, annular illumination is established.

In a further embodiment, different light sources can be used within the illumination system. For example, a Laser-light-source such as a deep ultraviolet (DUV)-light source can be used for alignment of an EUV system, and an EUV-source can be used for illuminating a mask or a reticle in a scanning exposure process. For example, a projection exposure apparatus that provides for such an alignment comprises at least a first light source that emits light of a first wavelength, and a second light source that emits light of a second wavelength, wherein the first wavelength is different from the second wavelength. The scanning exposure process is performed with a scanning exposure apparatus comprising the inventive illumination system and a projection exposure objective, for example as disclosed in U.S. Pat. No. 6,353,470. The disclosure content of U.S. Pat. No. 6,353,470 is fully incorporated into the present application. Laser light sources are available for a variety of wavelength, e.g., 633 nm, 258 nm or 193 nm, and EUV light sources emit from about 126 nm to about 1 nm, which includes a range of about 20 nm to about 10 nm.

In a preferred embodiment of the invention, a second optical element with second raster elements is provided in or near a plane in which the secondary light sources are formed. The second raster elements are also denoted as pupil raster elements. Illumination systems comprising a first optical element with first raster elements and a second optical element with second raster elements are also called double facetted illumination systems.

In a double facetted illumination system as described for example in U.S. Pat. No. 6,438,199, whose disclosure content is incorporated to the full extent in this application, the illumination system comprises a plurality of first raster elements and a plurality of second raster elements. Each of the first raster elements is assigned to each of the second raster elements, thereby defining a light channel. In such a system the illumination setting in an exit pupil of the illumination system is determined by the assignment of the first and second raster elements to different light channels. By configuring the light channels, that is by the assignment of a specific first raster element to a specific second raster element, a specific illumination setting in the exit pupil, e.g. a annular setting or a circular setting is achieved.

In a preferred embodiment of the invention, a collector is assigned to each light source. The collector can be a normal incidence collector or a grazing incidence collector as described, for example, in U.S. Patent Application No. 2003/0043455 or a combination of collectors as described, for example, in U.S. Patent Application No. 2003/0095623. Furthermore, a spectral filter element or a reflecting element can be assigned to each light source. Such a filter element is shown, for example, in U.S. Patent Application No. 2002/0186811. The disclosure content of these aforementioned applications is incorporate herein in their entity.

In a further embodiment of the invention, each light source is assigned to a collecting element for collecting radiation from each of the light sources and focusing the radiation into a focus point for each light source. In a preferred embodiment, each focus point of the different light sources is substantially identical. In another preferred embodiment, different light source images of the plurality of light sources are overlapped at a selected position of the illumination system. Nevertheless, according to the invention different areas of the first optical element are illuminated.

In a further embodiment of the invention, a light source device is provided with an optical unit for combining light bundles that are emitted from different light sources to form a combined light bundle traveling towards an optical device for illuminating a field in an image plane. In a preferred embodiment, a focusing optical element is situated in a light path from the light sources to the optical unit. The focusing optical element focuses light emitted by the different light sources onto the optical unit.

In a preferred embodiment the focusing optical element comprises a plurality of focusing raster elements. The focusing raster elements divide the light bundles associated to each different light source further into a second plurality of light bundles. Each of the second plurality of light bundles is focused by each of the focusing raster elements onto the optical unit.

Apart from the illumination system, the invention also provides for a projection exposure apparatus with a plurality of light sources. In a preferred embodiment, at least one of this plurality of light sources can be operated under a different operating condition than the other light sources. For example, the light sources can emit different wavelengths from one another. In a case where the light sources are pulsed lasers, different operating conditions can be provided by different timing schemes for emitted laser pulses. In an especially preferred embodiment the light beams of different light sources can be incoherently superimposed to reduce the degree of coherence of the illumination system.

The projection exposure system comprising a plurality of light sources in an advantageous embodiment comprises further optical elements such as collectors or condensers, for collecting and condensing light emitted from the plurality of light sources to illuminate a reticle in an area to expose a pattern on a substrate.

Further preferred embodiments of the invention are the subject of the dependent claims.

DESCRIPTION OF THE DRAWINGS

The invention shall now be described with reference to the drawings, in which:

FIG. 3 shows an illumination of an exit pupil of a system according to FIG. 1;

FIGS. 4A-4D show illumination of an exit pupil with coupling of 3, 4, 5 and 6 sources;

FIGS. 16.1-16.3 show different illumination settings in or near a plane where secondary light sources come to lie;

FIG. 19 shows a quadropolar illumination setting in an exit pupil;

FIG. 20 shows an EUV projection exposure apparatus with an illumination system having three different light sources and a common focus;

FIG. 24 shows a schematic view of an illumination system with a plurality of light sources and grazing incidence collectors.

DETAILED DESCRIPTION OF THE INVENTION

Figure 1:
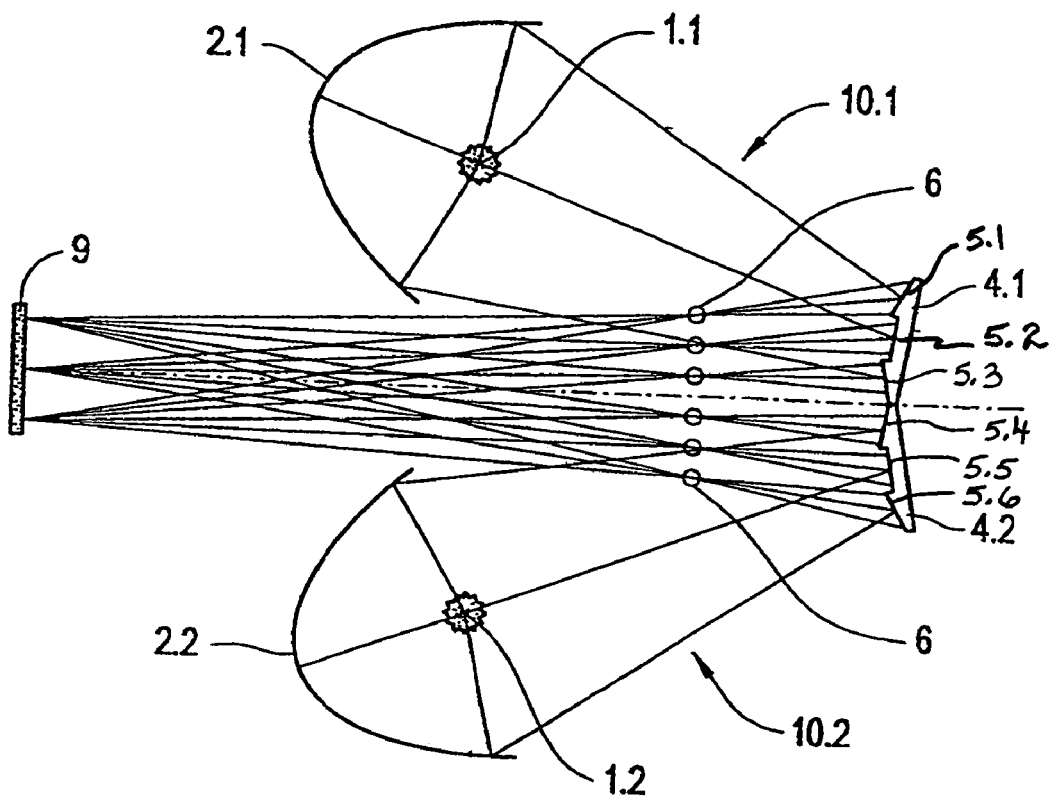
FIG. 1 shows a first embodiment of the invention, in which light of several light sources is superimposed according to the addition method.

FIG. 1 shows a layout of an illumination system in which light sources are coupled according to the addition method. Light sources 1.1, 1.2 in the present case has a small source diameter, in this case Laser plasma sources are further investigated. However, the examples are not restricted to Laser produced plasma sources.

Regarding the basic layout of EUV-illumination systems, we refer to U.S. Pat. No. 6,198,793 B1 whose disclosure contents are incorporated in their entirety in the present application.

The illumination system of FIG. 1 includes a plurality of partial systems, which may also be referred to as subsystems. FIG. 1 shows two partial systems, namely partial systems 10.1 and 10.2. However, the illumination system of FIG. 1 is described herein as having four partial systems, two of which are not shown in FIG. 1 as they would lie before or behind the paper plane of FIG. 1. Partial systems 10.1, 10.2 are substantially identical in construction. Partial system 10.1 includes a light source 1.1, a collector mirror 2.1, and a field raster element plate 4.1, and similarly, partial system 10.2 includes a light source 1.2, a collector mirror 2.2, and a field raster element plate 4.2. Field raster element plate 4.1 includes field raster elements 5.1, 5.2 and 5.3, and field raster element plate 4.2 includes field raster elements 5.4, 5.5 and 5.6. A raster element may also be referred to as facet, e.g., a mirror facet in a reflective embodiment and a lens facet in a refractive embodiment.

The light of each light source 1.1, 1.2 is collected by means of the collector mirror 2.1, 2.2 assigned to a particular light source 1.1, 1.2 and transformed into a parallel or convergent light bundle. The field raster elements 5.1-5.6 decompose the light bundle and create secondary light sources 6 in a diaphragm plane of the illumination system. These secondary light sources 6 are imaged by a field lens (not shown) or a field mirror (not shown) in an exit pupil of the illumination system, which is also an entrance pupil of a projection objective lens (not shown). The field raster elements 5.1-5.6 are arranged on the field raster element plates 4.1, 4.2 and oriented such that images of the field raster elements 5.1-5.6 are superimposed in a reticle plane 9.

Light bundles from the partial systems 10.1, 10.2 are combined at a position of the field raster element plates 4.1, 4.2. The field raster element plates 4.1, 4.2 are located on a pyramid, or, in general, a polyhedron element, where a number of sides of the polyhedron element correspond to the number of coupled partial systems. An angle of inclination of the sides of the polyhedron element is chosen such that illuminated fields of the partial systems 10.1, 10.2 in the reticle plane 9 are superimposed.

The partial systems parts 10.1, 10.2 are arranged such that their partial pupils optimally fill the diaphragm plane of the illumination system.

The partial systems 10.1, 10.2 are oriented such that they possess a common system axis. The angular spacing of the partial system is then 360°/number of partial systems.

Figure 2:
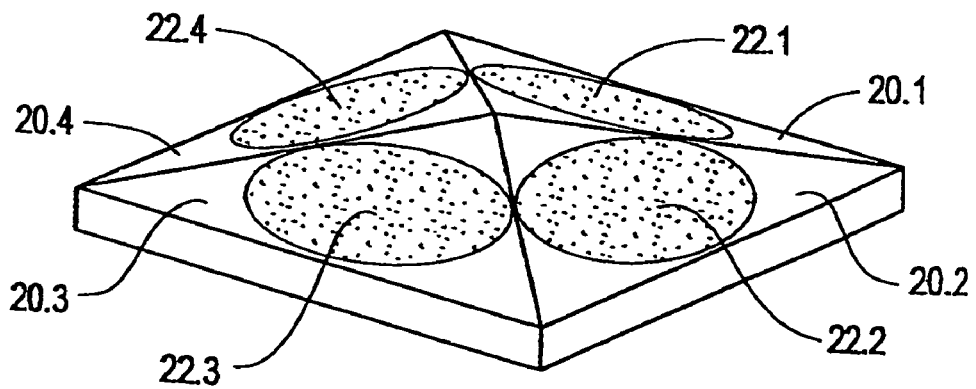
FIG. 2 shows an arrangement of raster element field plates on an equilateral pyramid.

For four partial systems, FIG. 2 shows the illumination of a pyramid, and more particularly, illuminated areas 22.1, 22.2, 22.3, 22.4 on four lateral surfaces 20.1, 20.2, 20.3, 20.4, respectively. Although not shown in FIG. 2, one field raster element plate is arranged in illuminated area 22.1, 22.2, 22.3, 22.4. For example, field raster element plate 4.1 can be arranged in illuminated area 22.2, and field raster element plate 4.2 can be arranged in illuminated area 22.4.

The field raster elements 5.1-5.6 are arranged and oriented such that images of the field raster elements 5.1-5.6 overlap in the reticle plane 9. An angle of inclination of the pyramid surfaces 20.1, 20.2, 20.3, 20.4 is chosen such that illuminated fields of the four partial systems superimpose in reticle plane 9.

FIG. 3 shows four areas of illumination in a diaphragm plane provided by four circular partial pupils 30.1, 30.2, 30.3, 30.4. The four circular partial pupils 30.1, 30.2, 30.3 and 30.4 are, in turn, divided into individual secondary light sources 65 corresponding to a number of illuminated field raster elements of the field raster element plates. Each field raster element provides for a secondary light source 65. In a case of four raster element plates with a plurality of raster elements, there are four partial pupils each having secondary light sources 65 corresponding to the number of raster elements on each of the four raster element plates.

In FIG. 3, an aperture of the total system is $NA_{Obj}=0.025$ and an aperture of each of the partial systems is $NA_{Teilsystem}=0.0104$.

FIGS. 4A through 4D show arrangements and symmetries of partial pupils 30.1, 30.2, 30.3, 30.4, 30.5, 30.6 with coupling of 3, 4, 5 and 6 sources, respectively.

Maximum diaphragm diameters of the partial systems are derived from the total aperture $NA_{Obj}$ of the objective lens in the diaphragm plane and the number of partial systems.

$$NA_{Teilsystem} = \frac{NA_{Obj}}{1 + \frac{1}{\sin\left(\frac{\pi}{Anzahl}\right)}}$$

Where:
Teilsystem=partial system; Anzahl=number of partial systems

When the pupil of each partial system is filled, the pupil can be illuminated to η% of the maximum.

$$\eta = Anzahl \cdot \frac{1}{\left(1 + \frac{1}{\sin\left(\frac{\pi}{Anzahl}\right)}\right)^2}$$

Where:
Anzahl=number of partial systems

The following table gives $NA_{Teilsystem}$ and the filling factor η for $NA_{Obj}=0.025$:

| Number of system parts | $NA_{Teilsystem}$ | Filling factor $\eta_{max}$ |
|---|---|---|
| 2 | 0.0125 | 0.500 |
| 3 | 0.0116 | 0.646 |
| 4 | 0.0104 | 0.686 |
| 5 | 0.0093 | 0.685 |
| 6 | 0.0083 | 0.667 |
| 7 | 0.0076 | 0.641 |
| 8 | 0.0069 | 0.613 |
| 9 | 0.0064 | 0.585 |
| 10 | 0.0059 | 0.557 |

Hence, the maximum attainable filling factor with the addition method using four partial systems and $NA_{Obj}=0.025$ is achieved with $\eta_{max}\approx0.69$. As a boundary condition, overall Etendue of the coupled sources may not exceed system Etendue $LC_{ill}=\eta_{max}\cdot LC_{Obj}$ by a large amount. The number of sources to be coupled can be larger as the required etendue, however, this will raise geometrical losses of the illumination system and thus heat load due to absorbed power of unnecessary light. As a general rule, the etendue of the light sources therefore should not exceed the etendue to be provided by the illumination system by more than 30%:

$$\Sigma LC_i \leq 1.3 \cdot LC_{ill}$$

all sources

Figure 5:
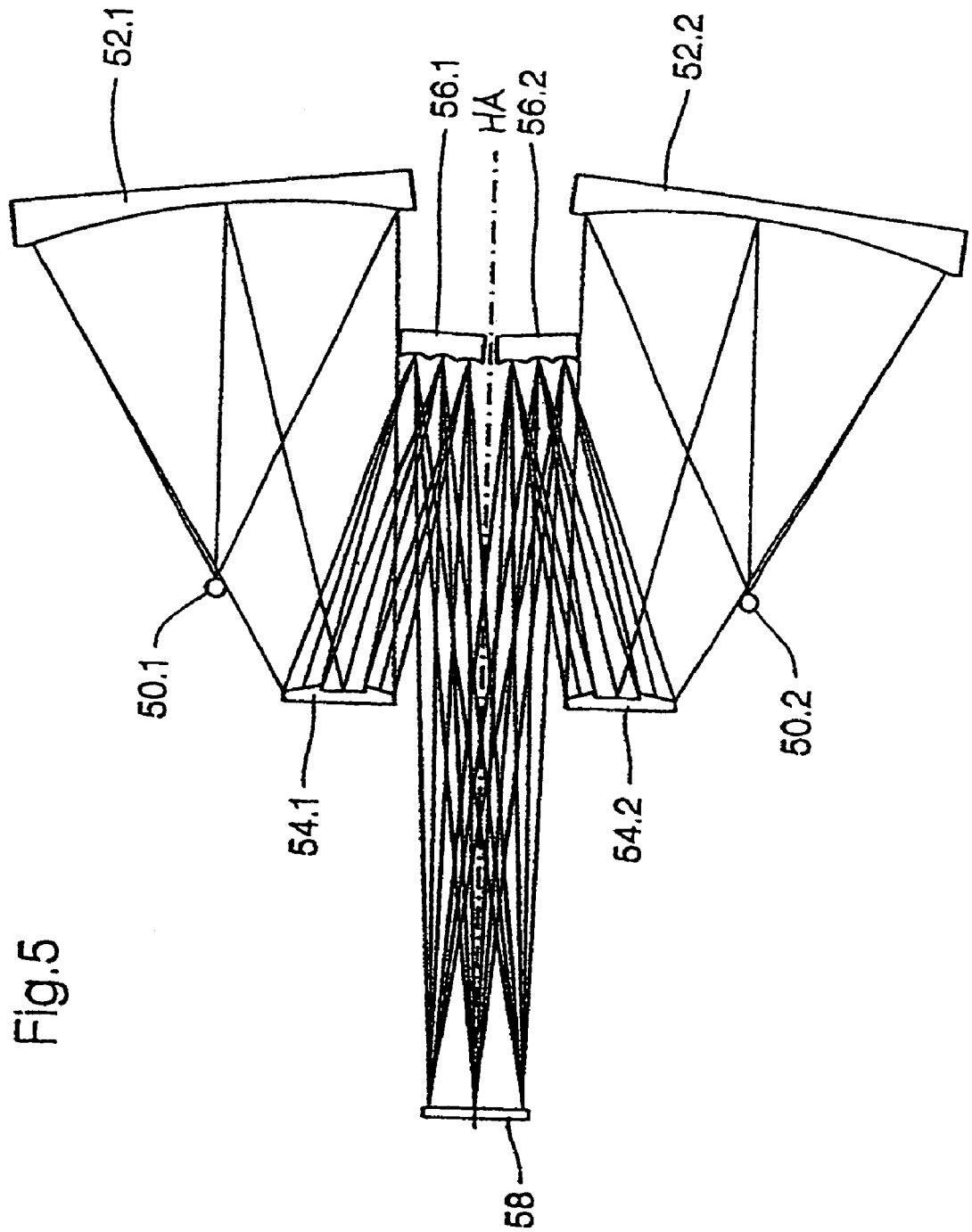
FIG. 5 shows a second embodiment of the invention, in which light of several light sources is coupled by the addition method in a diaphragm plane.

FIG. 5 shows a second form of embodiment of the invention, in which light sources 50.1, 50.2 are pinch plasma sources, for example. The source diameter of the pinch plasma sources is not negligible.

A partial illumination system with pinch plasma source comprises the light source 50.1, 50.2, a collector mirror 52.1, 52.2, which collects light and illuminates a field raster element plate. 54.1, 54.2. The field raster elements of the field raster element plate 54.1, 54.2 produce secondary light sources. At the location of the secondary light sources, the pupil raster elements are arranged on a pupil raster element plate 56.1, 56.2. The field raster elements of the field raster element plate 54.1, 54.2 are used to shape a field and the pupil raster element of the pupil raster element plate 56.1, 56.2 correctly image the field raster element in a reticle plane 58. Preferably, each field raster element is assigned to a pupil raster element. The light is guided by reflection from the field raster elements of the field raster element plates 54.1, 54.2 to the pupil raster element of the pupil raster element plate 56.1, 56.2 and from there to reticle or object in the reticle plane 58.

Partial systems are brought together at the location of pupil raster element plates. The pupil raster element plates are located in general on a polyhedron element, e.g. on a pyramid. The number of sides of the pyramid corresponds to the number of coupled partial systems. The angle of inclination of the pyramid sides is chosen such that the illuminated fields of the partial systems are brought together in a reticle plane.

If the partial systems have a common system axis HA, then the angular spacing of the partial systems is 360°/number of partial systems and the pupil raster element plates of the partial systems are preferably arranged on lateral surfaces of a pyramid, as shown, for example, in FIG. 2.

The advantage of the addition method of coupling is that identical or similar illumination systems can be coupled together. The raster element plates of the partial systems are separate and can thus be fabricated separately.

In the addition method, it should be noted that intensity differences of the individual light sources are directly passed on to the illumination of the pupils, and thus the intensity of the partial pupils is dictated by the source power.

The intensity distribution in the diaphragm plane becomes independent of the intensities of the individual sources if one mixes the secondary light sources in the pupil plane. This technique is also hereafter designated as the mixing method.

In the addition method, beam bundles of each light source only cross each other after passing through the diaphragm plane. In contrast, in the mixing method the beam bundles cross each other in front of the diaphragm plane and are mixed in the diaphragm plane. In both of the addition method and the mixing method, a maximum aperture for each partial system is adapted to a desired angle of filling of an objective aperture. In the mixing method, as in the addition method, partial systems of substantially identical construction can be coupled together for the individual light sources. The partial systems can be uniformly arranged about a common system axis. The partial systems are coupled together in a plane of secondary light sources.

Figure 6:
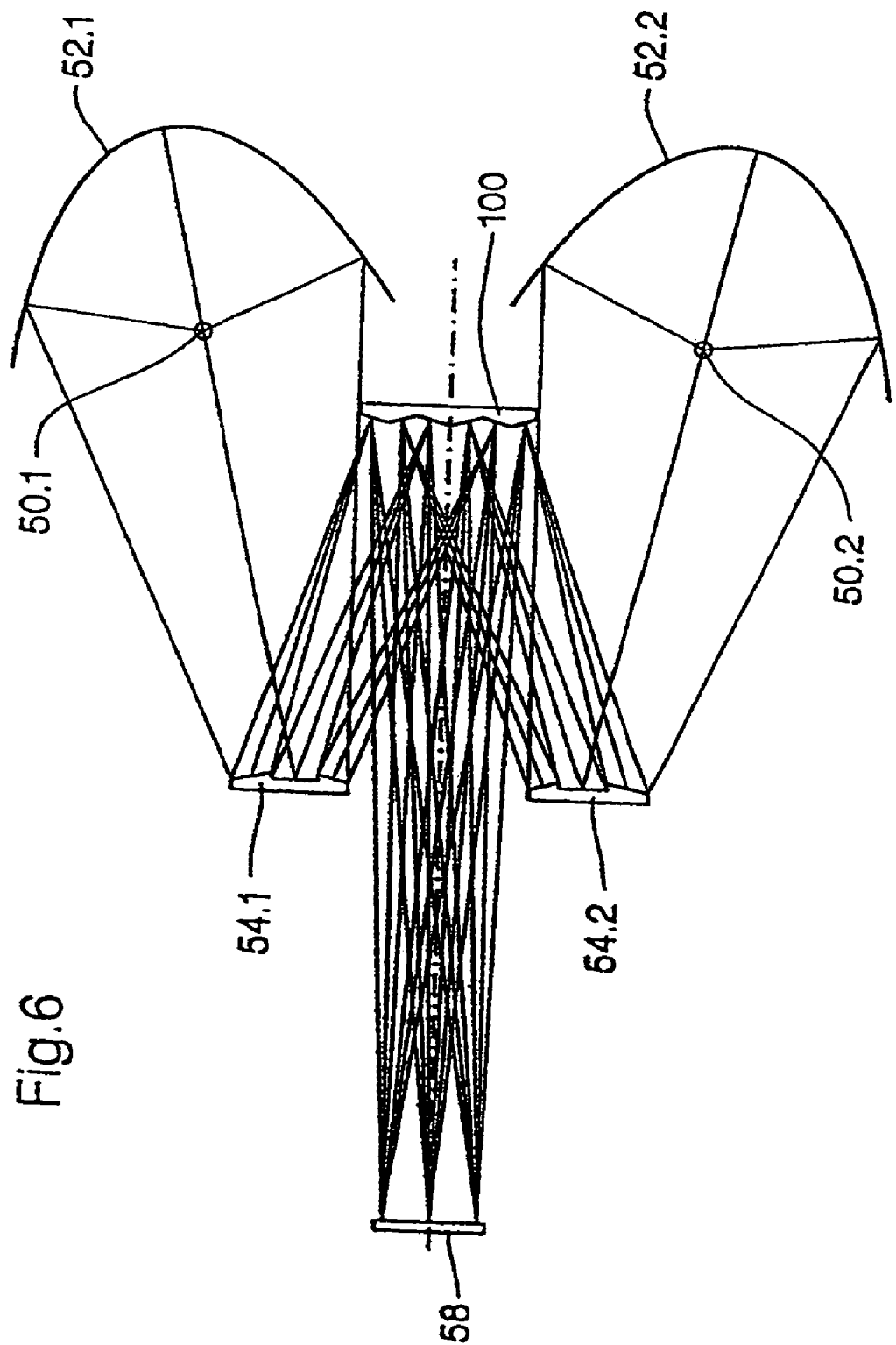
FIG. 6 shows a third embodiment of the invention, in which light of several light sources is coupled by the mixing method in a diaphragm plane.

FIG. 6 shows an illumination system based on the mixing method for coupling of several light sources.

The light sources can be Laser plasma sources. The same components as in FIG. 5 are designated with the same reference numbers. In contrast to FIG. 5, for example, in the system of FIG. 6 there is a single pupil raster element plate 100, which includes a plurality of pyramids. The pupil raster element plate 100 is arranged at the location of the secondary light sources, which are produced by the field raster elements of the field raster element plates 54.1, 54.2. A secondary light source is located on each side of the plurality of pyramids.

Figure 7:
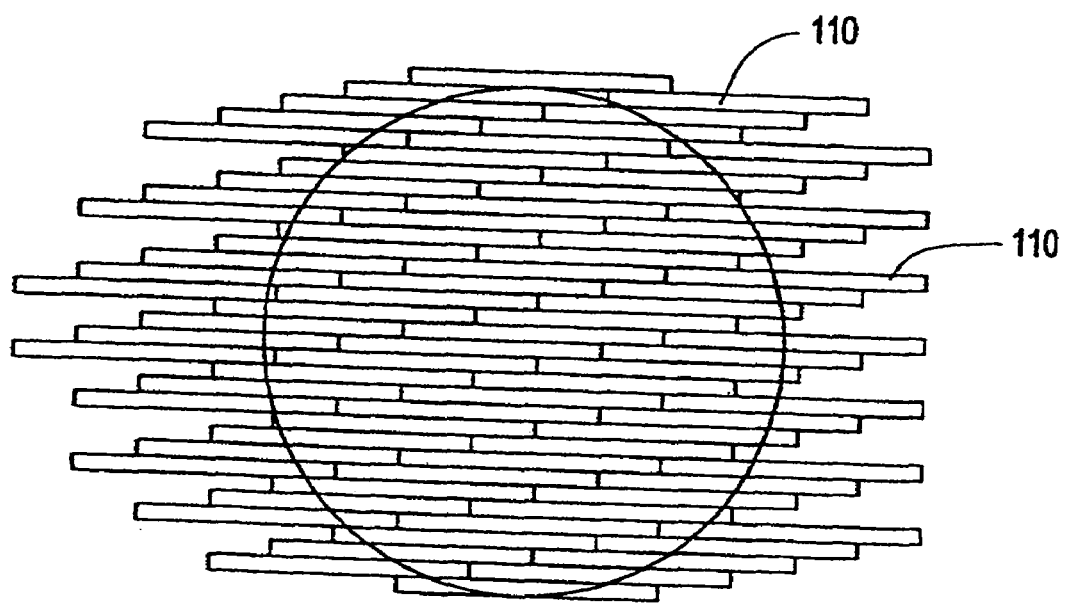
FIG. 7 shows an arrangement of field raster elements on field raster element plates of a system according to FIG. 6.

FIG. 7 is a schematic representation of an arrangement of field raster elements 110 on a field raster element plate. Each field raster element plate produces a grid of secondary light sources in a diaphragm plane. The distribution of the secondary light sources in the diaphragm plane corresponds to the arrangement of the positions and tilt angles of the field raster elements. The field raster elements 110 of FIG. 7 are rectangular with a high aspect ratio of the dimensions in x and y, as required for scanning exposure systems. In a conventional arrangement, a shape of the field raster element is directly given by a shape of an exposure field and can be rectangular or arc-shaped, for example. For fabrication reasons, field raster elements of a simple shape like a rectangular shape are preferable even when an arc-shaped field is required. In this case, the arc-shaped field can be formed, for example, by a field-forming element.

Figure 8:
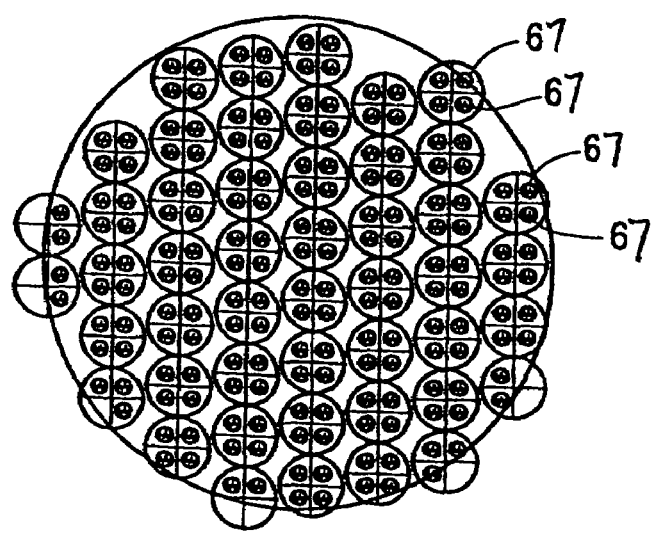
FIG. 8 shows an arrangement of secondary light sources in a diaphragm plane of a system according to FIG. 6.

By shifting the partial systems or by changing the arrangement of positions and tilt angles of the field raster elements, as depicted in FIG. 8, the grids of secondary light sources can be brought to be located next to each other, corresponding to the number of partial systems.

Figure 9:
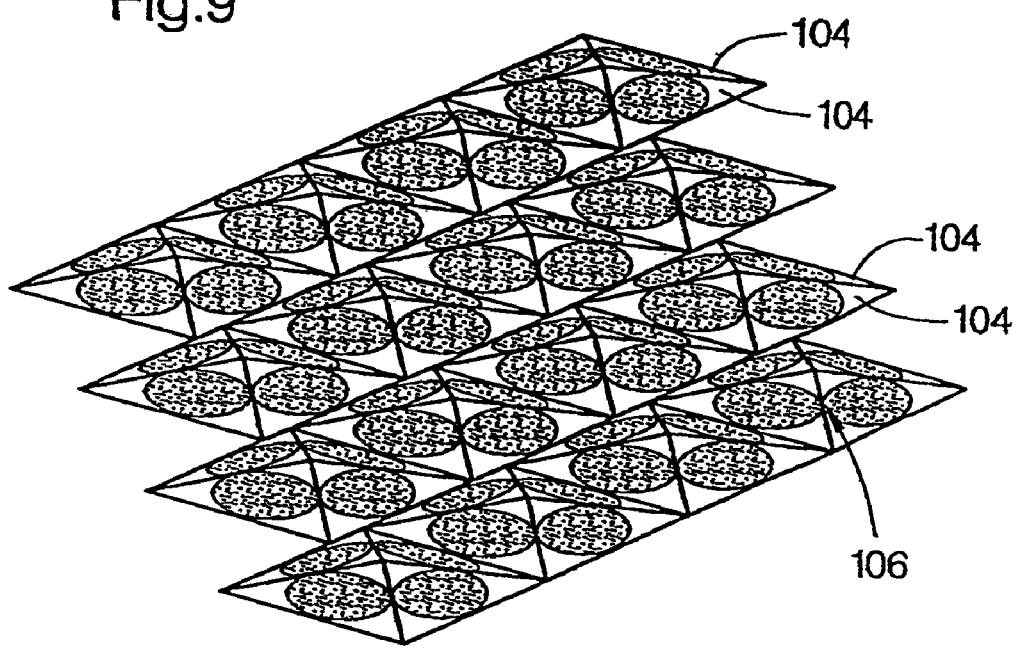
FIG. 9 shows a segment of a pupil raster element plate of a system according to FIG. 6 with a plurality of pyramids, on whose flanks the pupil raster elements are located.

If four sources are coupled together, an arrangement of secondary light sources 67 is obtained as shown in the schematic representation of FIG. 8. For a correct superimposing of the four partial systems, each set of secondary light sources is located on a pyramid mirror. Flanks of the pyramid are inclined such that images of the field raster elements are superimposed in a reticle plane. The schematic representation of FIG. 9 shows a segment of a pupil raster element plate. Individual pupil raster elements 104 are formed by flanks of an equilateral pyramid 106.

If the Etendue (LC) of the individual light sources is small, the pupil raster elements can be designed as plane mirrors, i.e., the flanks of the equilateral pyramids 106 are planar.

When the light source diameter is not negligible, such as with pinch plasma sources, the pupil raster elements 104 must image the field raster elements in the object plane, for example, the reticle plane. In this case, a concave mirror surface 108, as shown in FIG. 10, is worked into the pyramid flanks.

Figure 10:
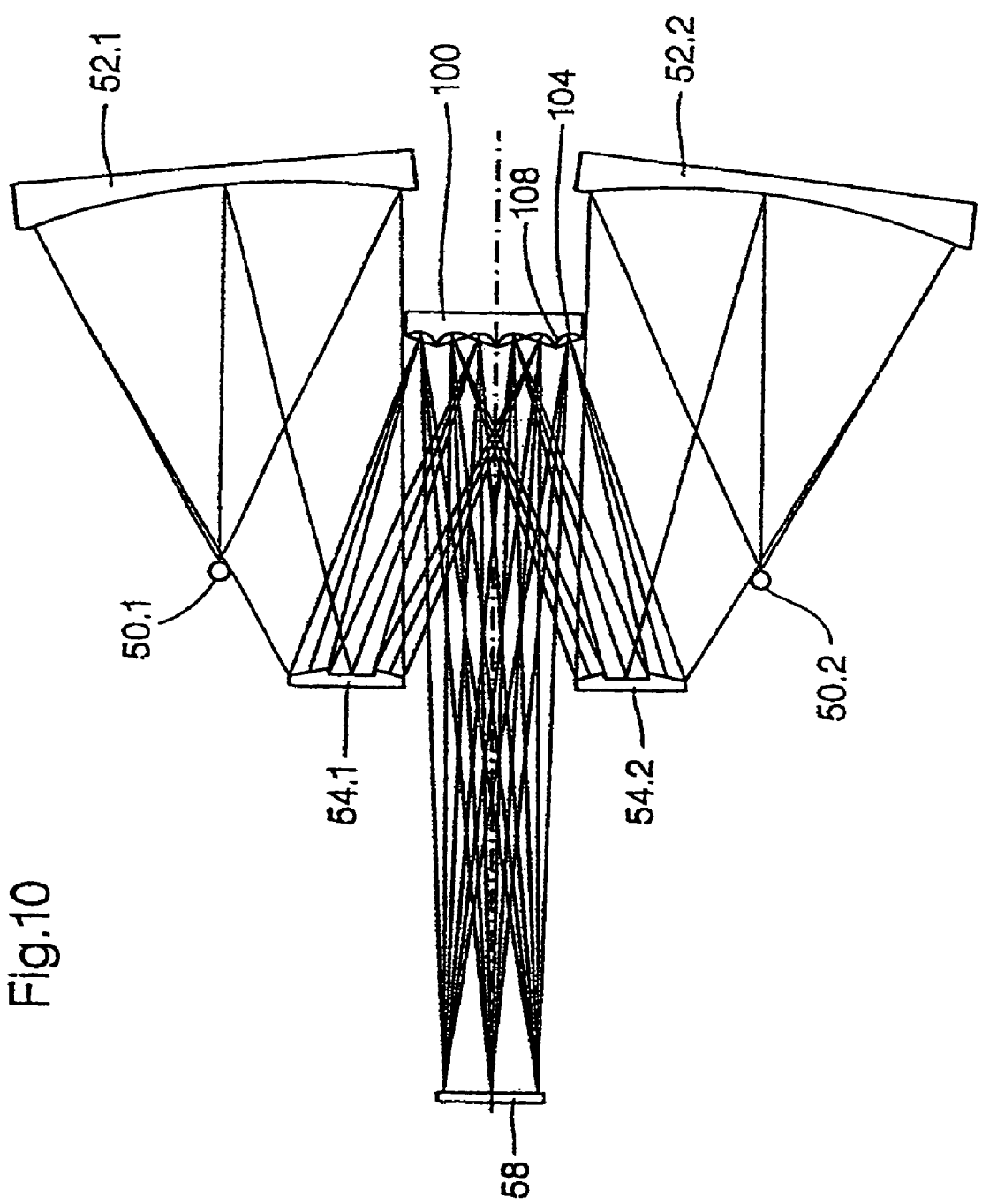
FIG. 10 shows a fourth embodiment of the invention, in which light from several light sources is coupled in a diaphragm plane by means of imaging raster elements according to the mixing method.

The schematic representation of FIG. 10 shows a system in which several pinch plasma sources are coupled with a pupil raster element plate comprising pupil raster elements with concave surfaces. The same components as in FIG. 6 are given the same reference numbers.

The examples shown in FIGS. 5 through 10 are designed for four coupled light sources. However, FIGS. 5, 6 and 10 show only two of four light sources, namely light sources 50.1 and 50.2, whereas the other two of four light sources lie before or behind the paper plane of the figures. Nevertheless, the same method can be used for three, five, six or more sources. The grids should then be shifted such that the secondary light sources are located on the side faces of pyramids. The degree of filling of the pupil is limited similar to the addition method.

The advantages of the mixing method are that the individual sources are mixed in the pupil plane. Fluctuations in source intensity can be tolerated, because they do not directly impact as inhomogeneous pupil illumination. Furthermore, the system pupil can be filled more uniformly with secondary light sources.

As a third method of coupling several light sources together, the segment method shall be described.

Figure 11:
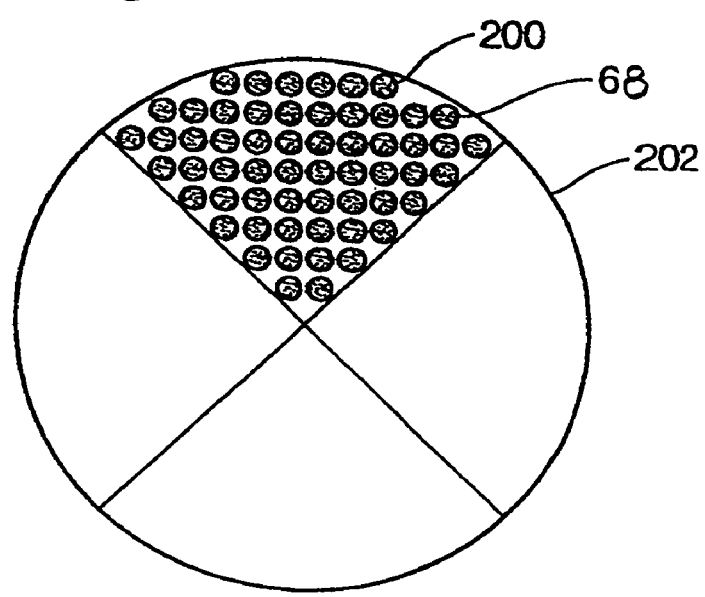
FIG. 11 shows an illumination of a segment of a pupil raster element plate in a system that operates according to the segment method.

The segment method works similarly to the addition method. The coupled illumination systems are uniformly distributed about a common system axis. Each system has a corresponding segment to fill a diaphragm plane. Instead of filling a segment with a circle as in the addition method, one can uniformly fill the segment by orienting the position and tilt angle of the field raster elements on the field raster element plate. FIG. 11 shows the illumination of a segment 200, which is one of four segments, of a system pupil 202, when four light sources are coupled together. In segment 200, secondary light sources 68 corresponding to the number of illuminated field raster elements are formed.

In order for individual light bundles to be correctly superimposed in a reticle plane, pupil raster elements must be arranged at the location of the secondary light sources to deflect the light bundles such that images of the field raster elements are superimposed in the reticle plane. The pupil raster elements have planar surfaces for point like sources or concave surfaces for extended light sources. Accordingly, field and pupil raster elements are tilted individually and without symmetry.

An advantage of the segment method is that it provides an optimal filling of the diaphragm plane with secondary light sources by a pair-wise tilting of field and pupil raster elements.

Figure 12:
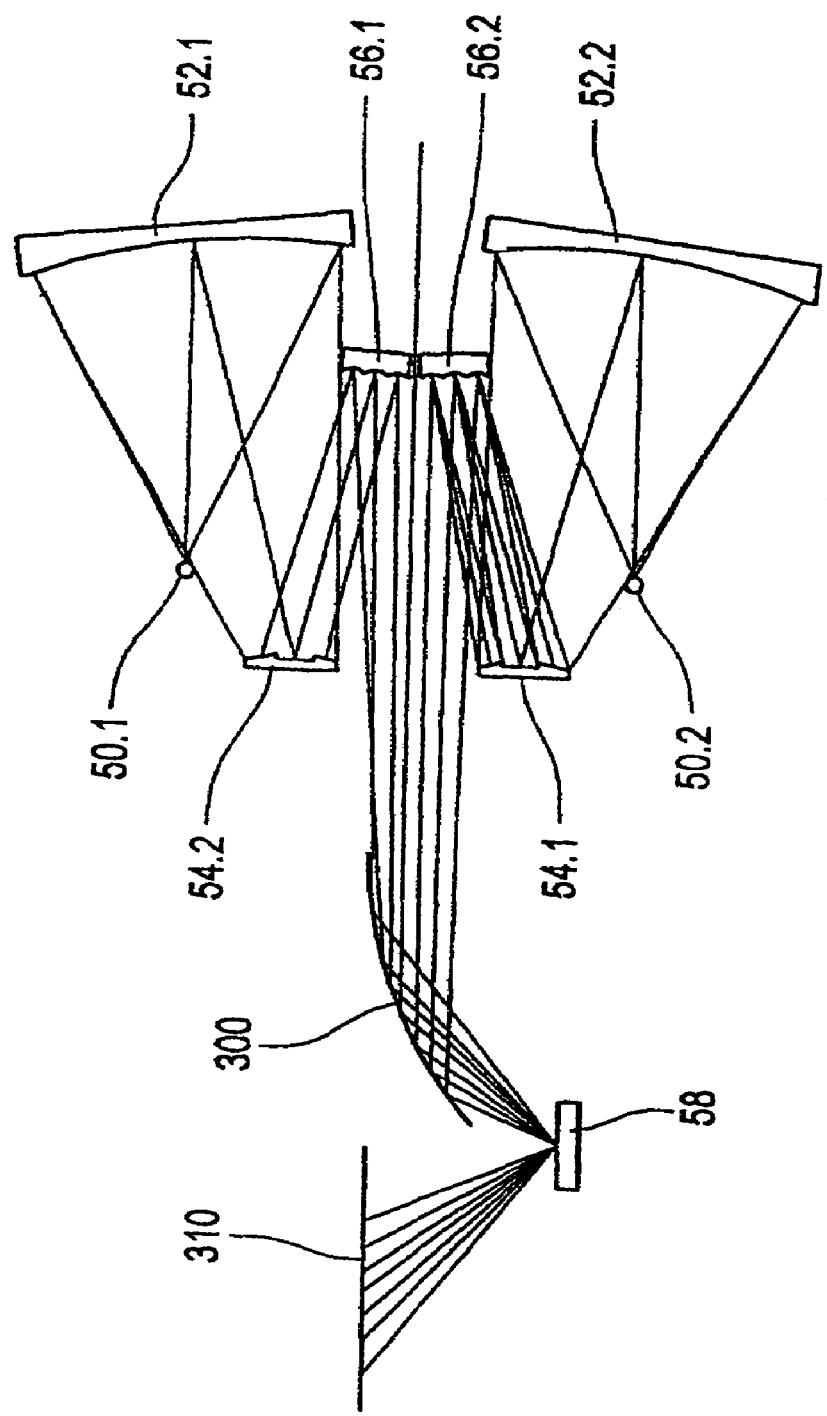
FIG. 12 shows an illumination system in which a field lens is situated in a light path between a plurality of secondary light sources and a reticle plane, and some rays are drawn from two light sources to the exit pupil.

Although, in the preceding examples of embodiments of the illumination systems, no optical components have been depicted after the lenses or mirrors with raster elements, a person skilled in the art would recognize that field lenses or field mirrors must be provided after the lenses or mirrors with raster elements in order to shape the annular field in the reticle plane and to image the diaphragm plane into the exit pupil of the illumination system, for example. This is shown in FIG. 12. The illumination system of the embodiment in FIG. 5 is adapted by introducing a field lens 300 in an optical path between the pupil raster element plates 56.1 and 56.2, and the reticle plane 58. The field lens 300 represents an optical unit, which can also comprise two or more mirrors. The field lens 300 images the plurality of secondary light sources formed on the pupil raster element plates 56.1 and 56.2 into an exit pupil 310. In this regard, concerning the basic layout of EUV illumination systems, refer to the EP 99 1 06348.8, U.S. Ser. No. 09/305,017 and PCT/EP 99/02999 applications, which were introduced above.

Figure 13:
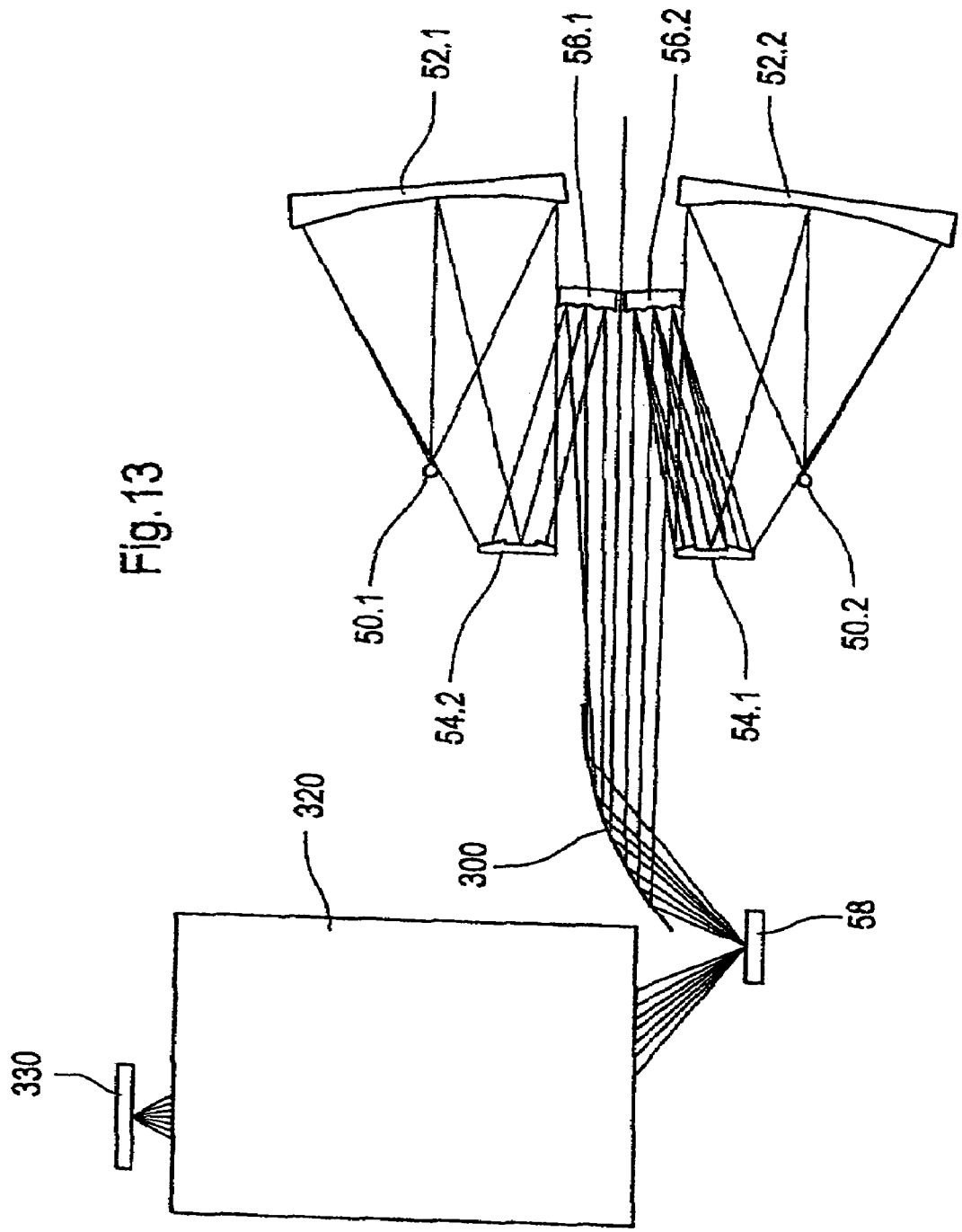
FIG. 13 shows a projection exposure system with the illumination system of FIG. 12.

An EUV-projection exposure system is shown in FIG. 13. The illumination system is already shown in FIG. 12. A reticle in the reticle plane 58 is imaged by a projection objective lens 320 onto a wafer 330. The EUV-projection exposure system can be realized as a stepper or scanning system.

Figure 14:
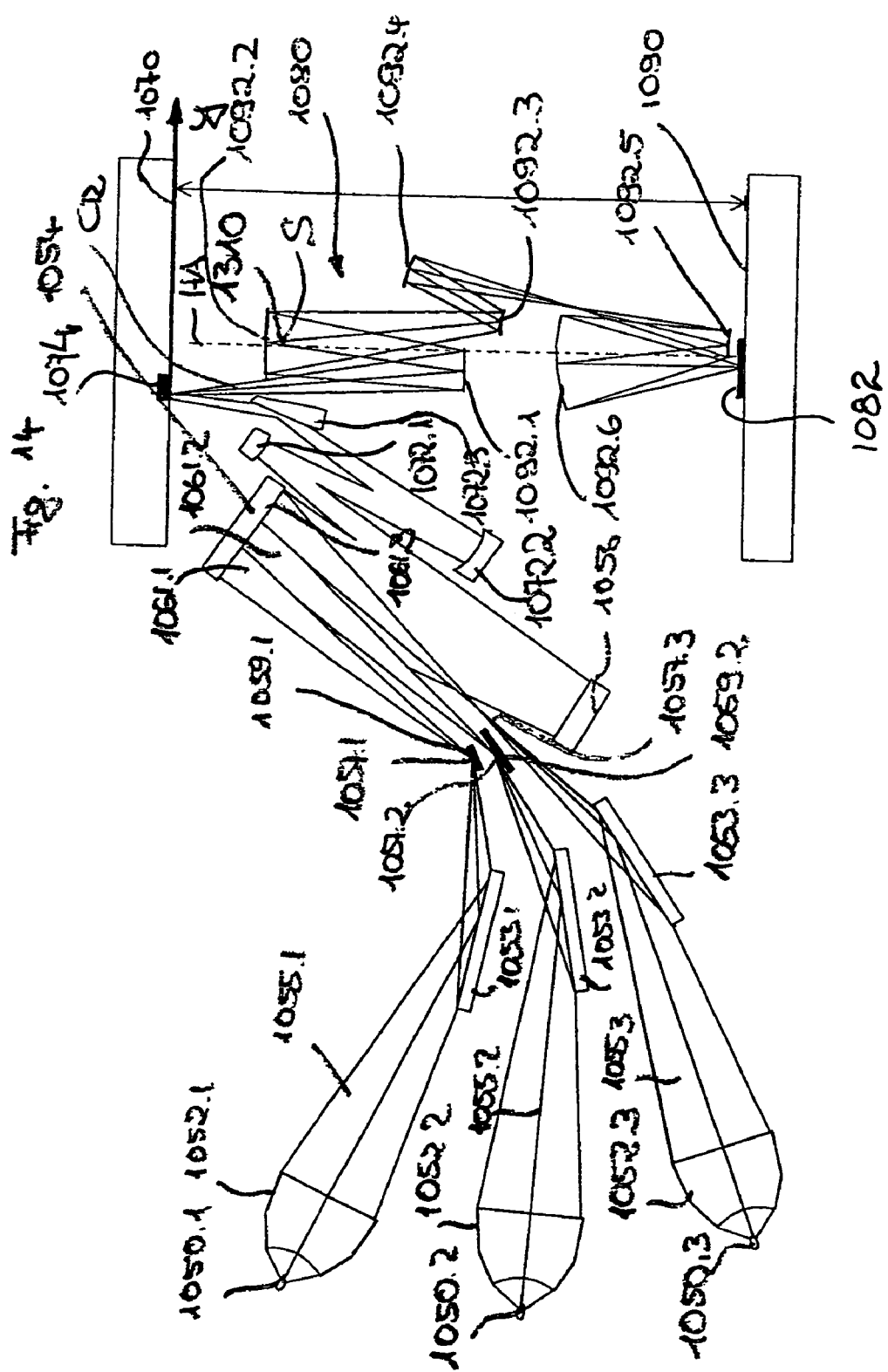
FIG. 14 shows a projection exposure system with an illumination system having a plurality of light sources illuminating different areas of an optical element with raster elements.

FIG. 14 shows a projection exposure apparatus having an illumination system with a plurality of light sources. The illumination system in the example has three different light sources 1050.1, 1050.2, 1050.3. To each light source 1050.1, 1050.2, 1050.3, there is associated a grazing incidence collector 1052.1, 1052.2,1053.3, for example, as described in the U.S. 2003/0043455 application. Furthermore to each light source 1050.1, 1050.2,1050.3, there is associated a spectral filter element 1053.1,1053.2,1053.3. Light of each light source 1050.1, 1050.2, 1050.3 is emitted in a light bundle 1055.1, 1055.2, 1055.3, respectively. Each light bundle 1055.1, 1055.2, 1055.3 has a focus point 1057.1, 1057.2, 1057.3, respectively. Each light bundle 1055.1, 1055.2, 1055.3 is redirected by a reflecting mirror 1059.1, 1059.2, 1059.3, respectively, onto a different area 1061.1, 1061.2, 1061.3, respectively, of a first optical element 1054, which includes a set of first raster elements.

In a reflective embodiment of the invention the first raster elements are mirror facets. In a refractive embodiment of the invention the first raster elements are lenses or off-axis segments of lenses with prismatic power.

Figure 15:
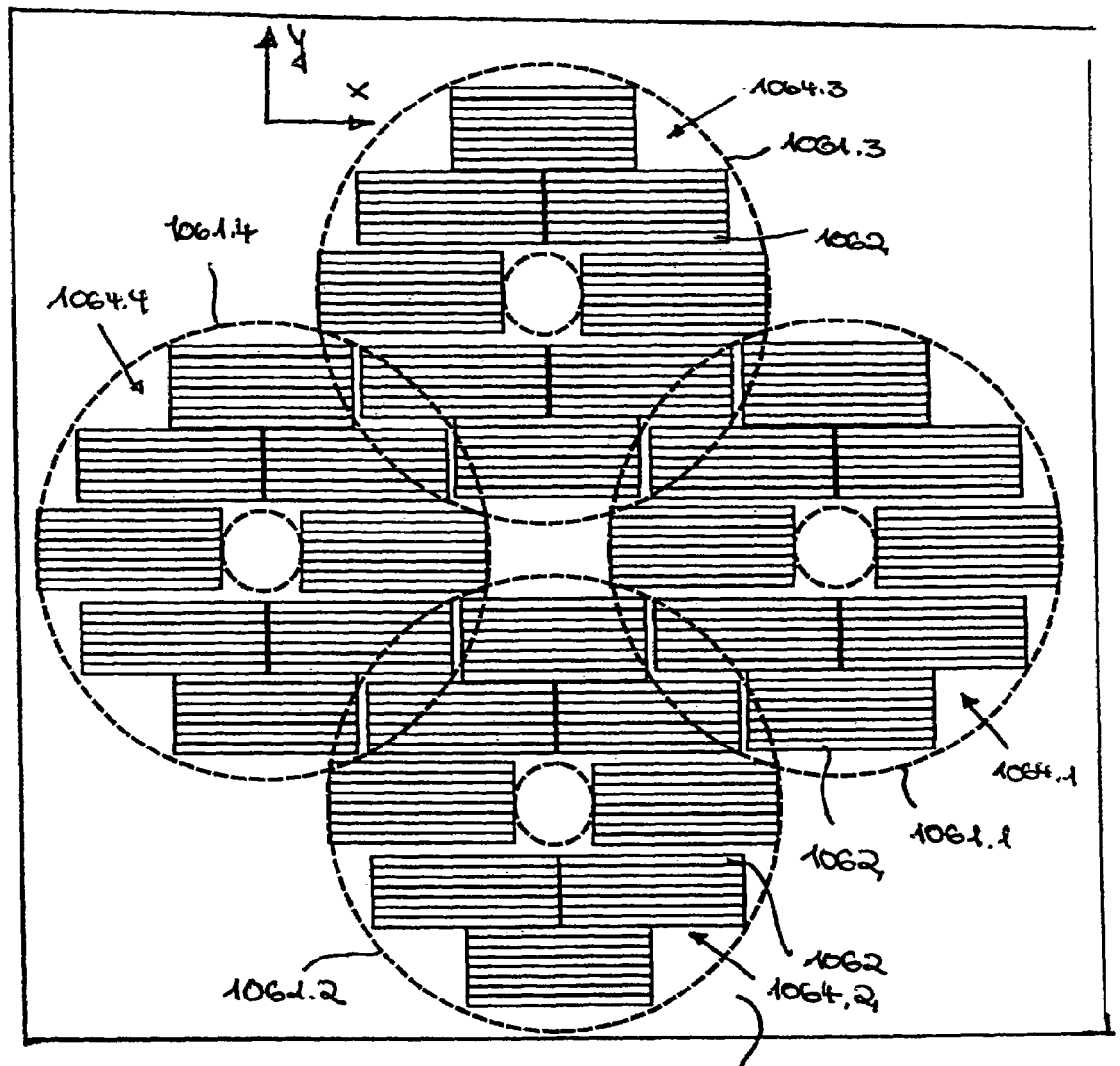
FIG. 15 shows an optical element in a y-x-plane, which is illuminated by four different light sources, having four groups of field raster elements.

FIG. 15 shows first optical element 1054 having four areas 1061.1, 1061.2,1061.3, 1061.4. Each area 1061.1, 1061.2, 1061.3, 1061.4 is illuminated by a different light source of the illumination system. In this case the illumination system comprises four different light sources (not shown). Each area 1061.1, 1061.2, 1061.3 and 1061.4 comprises, by way of example, 60 first raster elements 1062. The first raster elements shown in the reflective embodiment are mirror facets. The mirror facets within an illumination area 1061.1, 1061.2, 1061.3, 1061.4 form a first group of facets 1064.1, a second group of facets 1064.2, a third group 1064.3 of facets and a fourth group 1064.4 of facets.

The facets of each group of facets 1064.1, 1064.2, 1064.3, 1064.4 are arranged inside the area 1061.1, 1061.2, 1061.3, 1061.4 of one of the four light sources. In the embodiment shown, the light of each of the light source is collected by a collector with central obscuration.

In FIG. 15, there is also depicted an x-axis and a y-axis, which define a plane in which the first optical element 1054 is situated. The y-axis is parallel to the scanning direction in a scanning exposure system and the x-axis is perpendicular to the scanning direction in the scanning exposure system.

Referring to FIG. 14, the first raster elements of first optical element 1054 provide for secondary light sources in or near a plane in which a second optical element 1056 is situated. The second optical element 1056 includes a set of second raster elements. The first raster elements of the different areas 1061.1, 1061.2, 1061.3, 1061.4 (FIG. 15) reflect the light impinging onto the first optical element 1054 in such a way that a specific arrangement of secondary light sources is provided in the plane where the secondary light sources are situated. The arrangement of the secondary light sources in the plane is coincident with the illumination setting in an exit pupil 1310 of the illumination system. The illumination setting in the exit pupil can be, for example, a circular or annular shaped illumination setting.

FIGS. 16.1-16.3 show a distribution of 72 secondary light sources in the plane where the second optical element 1056 is situated. Each secondary light source corresponds to a second raster element of the second optical element 1056. FIGS. 16.1-16.3 show different illumination settings, namely, a circular illumination setting (FIG. 16.1), a ring-shaped or annular illumination setting (FIG. 16.2) and a quadrupole illumination setting (FIG. 16.3). Ideally, the second raster elements of the second optical element 1056 are all the same size or at least big enough so that they are not completely illuminated by the secondary light sources.

FIG. 16.1 shows second raster elements 1066.1 that are illuminated in a circular illumination setting, being depicted dark. FIG. 16.2 shows the second raster elements 1066.2 in dark that are illuminated for the annular illumination setting, and FIG. 16.3 shows the pupil raster elements 1066.3 in dark that are illuminated in the quadrupole illumination setting.

In FIGS. 16.1-16.3 the second optical element 1056 carries all necessary second raster elements for three illumination-settings. In another embodiment, instead of second optical element 1056 carrying all necessary second raster elements for three illumination-settings, one could use three different second optical elements, each second optical element carrying only the facets for one illumination setting. To adjust the light channel for the different illumination settings as depicted, the angle of inclination of the field raster elements on first optical element can be changed.

In a preferred embodiment of the invention, for example, in a quadropolar illumination setting, which is a four-pole-illumination, each of the four poles is assigned to a separate light source. This principle also can be used for other multi-pole illumination settings.

Figure 17:
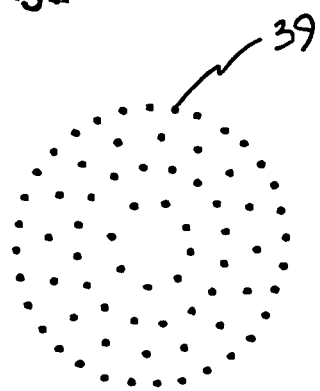
FIG. 17 shows a circular illumination setting in an exit pupil.
Figure 18:
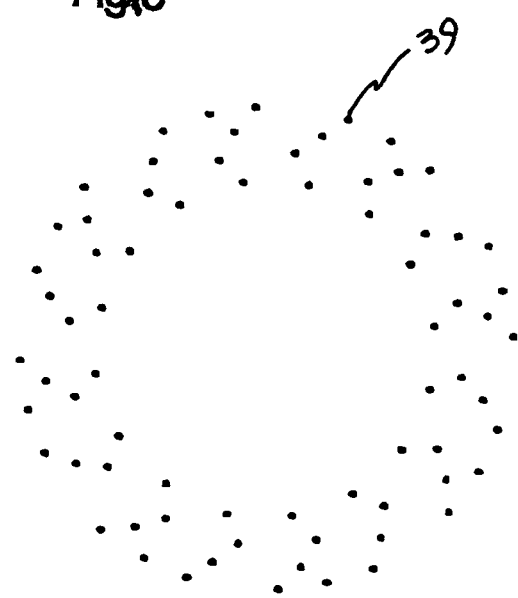
FIG. 18 shows an annular illumination setting in an exit pupil.

FIGS. 17-19 show distributions of the images of secondary light sources 39 for the different illumination settings in the exit pupil 1310.

FIG. 17 shows a circular illumination setting with $\sigma=0.4$ in the case of circular illumination of the pupil raster element plate.

FIG. 18 shows an annular setting with $\sigma_{out}/\sigma_{in}=0.8/0.4$ for ring-shaped illumination of the pupil raster element plate.

FIG. 19 shows a quadrupole illumination setting with four ring-circle segments as illumination.

In the light path from the light sources 1050.1, 1050.2, 1050.3 to a reticle plane 1070 in the embodiment shown in FIG. 14, three field-forming mirrors 1072.1, 1072.2, 1072.3 are arranged after the second optical element 1056. The three field forming mirrors 1072.1, 1072.2, 1072.3 serve to form a field in the reticle plane 1070. A reticle 1074 in reticle plane 1070 can be a reflection mask. The reticle 1074 can move in the y-direction, i.e. the scanning direction in the EUV system, if this system is designed as a scanning system.

A projection objective 1080 is located in a light path downstream from the reticle plan 1070. The projection objective 1080 is a six-mirror projection objective as shown, for example, in U.S. Pat. No. 6,353,470. An object 1082 to be exposed, for example, a wafer for an electronic device, is situated on a carrier system 1090 that can be moved. Mirrors 1092.1, 1092.2, 1092.3, 1092.4, 1092.5, 1092.6 of the projection objective 1080 are centered in respect to a common optical axis HA. A ring-shaped object field in reticle plane 1070 is situated eccentrically. A light beam between the reticle 1074 and the first mirror 1092.1 of the projection objective 1080 is tilted towards the optical axis HA of the projection objective 1080. Chief array angles with respect to a normal line of the reticle 1074 are preferably between 5° and 7°. The exit pupil 1310 of the illumination system, which is coincident with the entrance pupil of the projection objective 1080, is defined by the intersection point (S) of the chief ray (CR) of a central field point of an illuminated field, which is preferably a ring field in the field plane and the common optical axis HA.

As follows from FIG. 14, the illumination system is distinctly separated from the projection objective.

FIG. 20 shows a further embodiment of the invention. The same elements as in FIG. 14 are denoted with the same reference numbers. In contrast to the embodiment of FIG. 14, the different light sources 1050.1, 1050.2, 1050.3 have a common focus 1100. Nevertheless, as in FIG. 15, different areas of the first optical element 1054 are illuminated. An arrangement as shown in FIG. 15 has the advantage that the system can be operated with different numbers of light sources, as long as the required aperture at the intermediate focus 1100 is filled. All first raster elements, or so-called field facets, in a reflective system image the light sources 1050.1, 1050.2, 1050.3 at the common focus 1100 into the corresponding second raster element, or so-called pupil facet. It is thus possible to operate the same illumination system with either a single source of large etendue or several sources of smaller etendue. The light sources 1050.1, 1050.2, 1050.3 can be different from one another. This means, for example, that the light sources 1050.1, 1050.2, 1050.3 can emit light of different wavelengths or that the light sources 1050.1, 1050.2, 1050.3 are operated under different operation conditions. Also the light beams emitted form the light sources 1050.1, 1050.2, 1050.3 can be superimposed incoherently.

The etendue of the illumination system is given by the product of pupil area and field area, $\pi(\sigma \cdot NA)^2 \cdot X \cdot Y$. The etendue of an EUV lithography system is thus typically given by $\pi(0.8 \cdot 0.0625)^2 \cdot 104 \text{ mm} \cdot 8 \text{ mm} \approx 6.5 \text{ mm}^2$. Assuming, for example, a Laser plasma light source of 200 μm diameter and a collector with a collection aperture of 1, resulting in an etendue of $\approx \pi^2 \cdot 0.22 \text{ mm}^2 \approx 0.4 \text{ mm}^2$, a plurality of up to 16 light sources can, in principle, be coupled to fill the etendue of the illumination system without light loss. In this example, the first or field raster elements can be divided into a plurality of 16 groups of field facets, each one illuminated by one of the plurality of light sources. Assuming a total number of 224 first or field raster elements, each light source is assigned to a group of 14 raster elements. Each of the 16 groups of 14 first or field raster elements of, for example, the size of 52 mm×4 mm, form a block with an extension of 52 mm×14.4 mm=52 mm×56 mm. The collector optics for each light source is therefore designed in such a way that, for example, a circular area >76.5 mm is illuminated. In this case, all 16 first facets of one group are illuminated by one of the plurality of 16 light sources. Thus, the design of the collector optics depends on geometrical restrictions. If, for example, an intermediate source image is required as to provide a physical aperture to separate the source vacuum chambers from the vacuum chamber of the illumination system, an aperture of ≈0.04 at the intermediate source image is required, if the distance between intermediate source image and first or field raster element is about 1 meter (m). In this example a collector magnification of 25 is required, resulting in an intermediate source image diameter of ≈5 mm.

In a most preferred embodiment, the different areas on the first optical element with raster elements are spatially separated. This can be achieved, for example, by an anamorphotic or elliptical optical element as collector. Then each area can provide for a different intensity distribution at the first raster elements, adapted to the geometrical shape of groups of the first raster elements. The first raster elements are typically of rectangular shape. If a conventional collector is applied, the system suffers thus from large light loss due to the geometrical overlapping area of a circular intensity distribution produced by a conventional collector. With an anamorphotic collector, for example, established by a single gracing incidence reflection mirror or by mirrors with astigmatic power, the intensity distribution can be shaped more elliptical and the overlapping area, and thus the geometrical efficiency, can be improved. This is especially import if the number of light sources to be coupled is very large.

Figure 21:
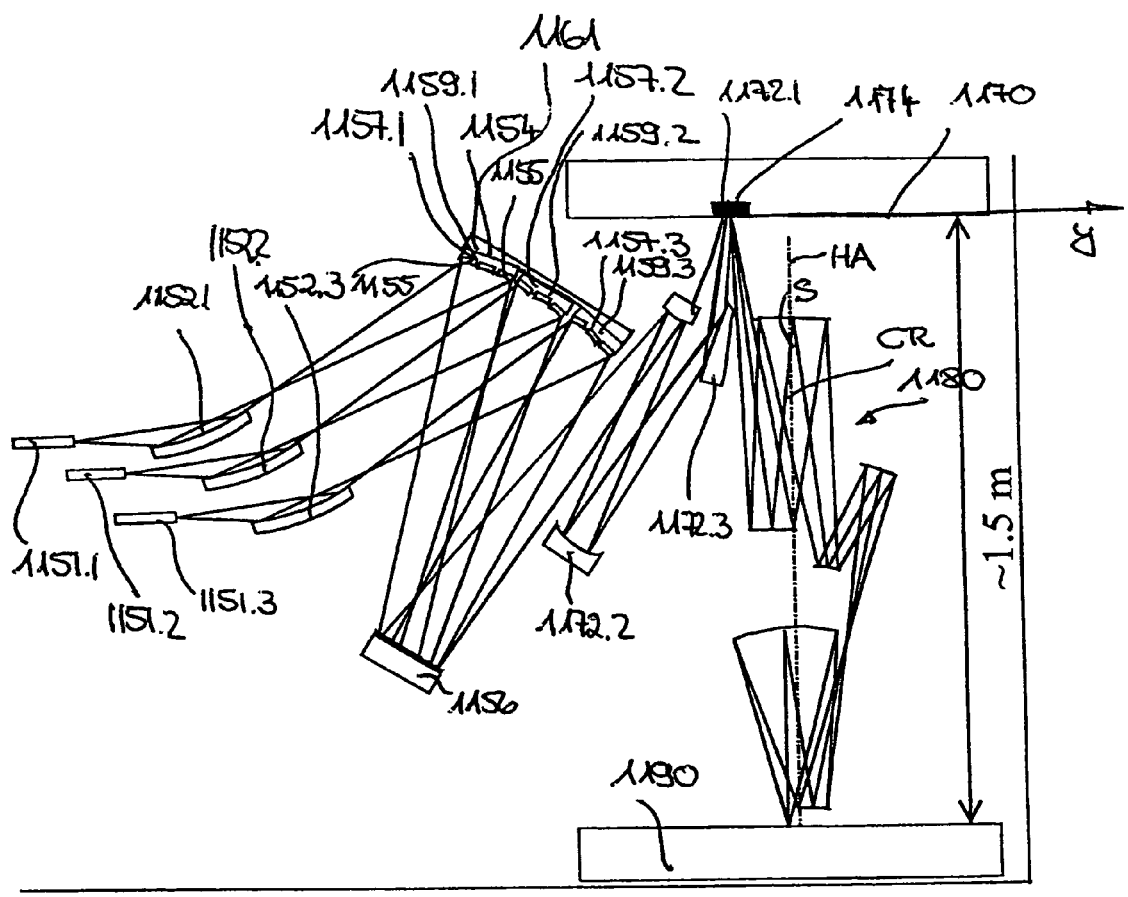
FIG. 21 shows an EUV projection exposure apparatus with a plurality of capillary discharge sources.

FIG. 21 shows an example where a plurality of capillary discharge light sources 1151.1, 1151.2, 1151.3 is illuminating an optical element 1154, which includes first raster elements 1155. In a reflective embodiment of the invention, first raster elements 1155 are field facet mirrors. Capillary discharge light sources, as disclosed for example in M. A. Klosner et al., Applied Optics Vol. 40, p 4849-4851 (2001) or in H. -J. Shin et al., Physical Review B, Vol. 50, Nr. 2, p1376-1382 (1994), provide a compact light source with small divergence angle and thus small etendue. For the same elements as in FIG. 14 the same reference numbers plus 100 are used. The capillary discharge light sources 1151.1, 1151.2, 1151.3 are illuminating, via a plurality of grazing incidence collectors, i.e., collectors 1152.1, 1152.2, 1152.3, different groups 1157.1, 1157.2, 1157.3 of field raster elements 1155. Each group 1157.1, 1157.2, 1157.3 is illuminated by a different capillary discharge light source 1151.1, 1151.2, 1151.3. The groups 1157.1, 1157.2, 1157.3 can comprise three separated raster element plates 1159.1, 1159.2, 1159.3 onto which the first raster elements 1155 are mounted. The raster element plates 1159.1, 1159.2, 1159.3 can be mounted all together onto a common plate 1161, and as such, all three raster element plates 1159.1, 1159.2, 1159.3 together form first optical element 1154. The groups 1157.1, 1157.2, 1157.3 are spatially separated. In the example, the collectors 1152.1, 1152.2, 1152.3 and curvatures of the first raster elements 1155 are substantially identical for each capillary discharge light source 1151.1, 1151.2, 1151.3. The capillary discharge light sources 1151.1, 1151.2, 1151.3 are arranged at different positions as shown in FIG. 21. By adjusting the collecting power of the collectors 1152.1, 1152.2, 1152.3 and selection of a proper, individual curvature of the field raster elements 1155, all light sources can be arranged in a single plane. Thus, by adapting the arrangement or the optical power of the plurality of raster elements to the individual collector optics, one can provide, for example, for secondary light sources arranged in a single plane, or for a particular illumination pattern in an exit pupil of the illumination system.

In the disclosed embodiment in FIG. 21, each capillary discharge light source 1151.1, 1151.2, 1151.3 is associated to a single collector 1152.1, 1152.2, 1152.3. Furthermore, a diffraction grating acting as spectral purity filter can be integrated into each collector 1152.1, 1152.2, 1152.3.

With this arrangement of a plurality of simple and small light sources, an array of substantially identical collection optical components and substantially identical first raster elements, an efficient and cheap illumination system for a high throughput lithography apparatus can be established.

Figure 22:
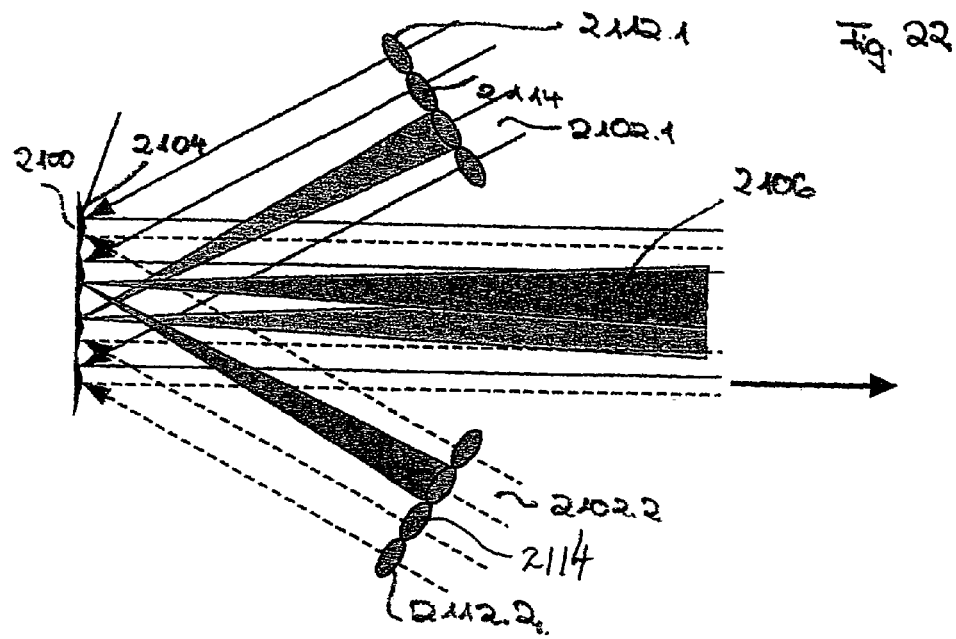
FIG. 22 shows a schematic view of an optical unit for combining light bundles from a plurality of light sources.

FIG. 22 shows a schematic view of an optical unit 2100 for combining light bundles 2102.1 and 2102.2. Optical element 2100 includes a plurality of raster elements 2104. Raster elements 2104 redirect the light bundles 2102.1, 2102.2 to form a combined light bundle 2106.

Preferably, in the path of light bundle 2102.1, prior to optical element 2100, there is situated an optical element 2112.1, which includes a plurality of focusing raster elements 2114. Similarly, in the path of light bundle 2102.2, prior to optical unit 2100, there is situated an optical element 2112.2, which also includes a plurality of focusing raster elements 2114.

Figure 23:
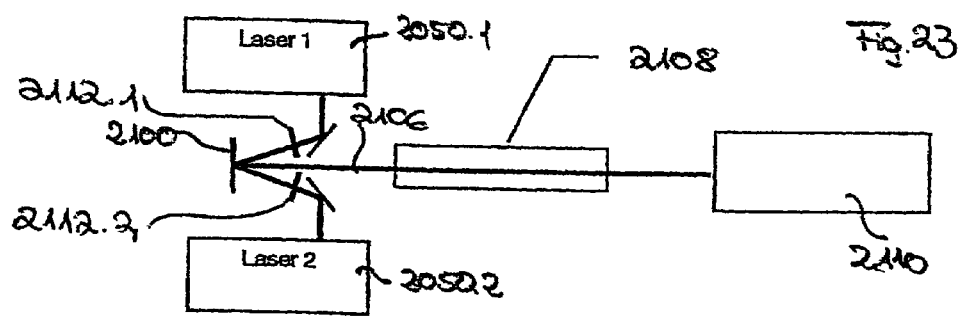
FIG. 23 shows a schematic view of an illumination system employing the optical unit of FIG. 22.

FIG. 23 shows a schematic view of an illumination system employing optical unit 2100. The illumination system of FIG. 23 also includes light sources 2050.1, 2050.2, optical elements 2112.1 and 2112.2, a light guiding system 2108, and an optical device 2110.

Light source 2050.1 emits light bundle 2102.1, and light source 2050.2 emits light bundle 2102.2. The combined light bundle 2106 from optical unit 2106 is directed to optical device 2110 for illuminating, for example, a field in a field plane.

An advantage of combining light of different light sources before entering the optical device 2110 is that light guiding system 2108 can be implemented as a normal light guiding or beam delivery system that includes lens elements and mirrors.

This coupling of light sources is especially advantageous for light sources with very small etendue such as EUV synchrotron radiation or Laser light sources as applied for 157 nm, 193 nm and others. Directly connected to the low etendue of such directional light sources is the high coherence of such light sources. Therefore the coupling over an integrating element such as a first array comprising a plurality of first raster elements and a mirror array comprising a plurality of pyramidal shaped mirrors, as shown in FIG. 8, offers the capability of an efficient light mixing and thus reduction of coherence effects such as speckles.

FIGS. 22 and 23 show a refractive embodiment of the invention. In such a case, the focusing optical elements, e.g., optical elements 2112.1 and 2112.2, comprises a plurality of lens facets as focusing raster elements 2114, and the light sources 2050.1 and 2050.2 are Laser light sources. In an embodiment using EUV radiation, the light sources are, for example, EUV synchrotron radiation light sources and the focusing raster elements are mirror facets.

FIG. 24 shows still another embodiment of the invention of coupling of several light sources. If the etendue of light sources is already of the same order as the etendue of the lithography apparatus, an efficient coupling of several light source is possible either by a temporal interlacing of the several pulsed light sources, which is very difficult if not impossible to control, or by a coupling of the light energy without increasing the etendue. This can be achieved by a repeated imaging of a plurality of light sources onto each other and thereby adding the light power. For example, EUV-Laser-Plasma sources typically operate at a plasma of low density and high optical transmission. It is therefore possible to optically image the excitation plasma of a first source on the plasma of a second and further sources. All plasmas are then in optical conjugate positions and all excited plasma radiation inside the collection aperture by the nested gracing incidence collectors is superposed to produce a high power EUV radiation intensity at the exit of the plurality of light sources to enable a high throughput lithography apparatus.

In more detail, the technique described above is shown in FIG. 24. A first light source 3000.1 is imaged by a first collector optic 3002.1 onto a second light source 3000.2. The first collector optic 3002.1 contains a normal incidence collector 3004.1 and a grazing incidence collector 3006.1. The grazing incidence collector 3006.1 is preferably a nested collector, as described, for example, in U.S. 2003/0095623. The second light source 3000.2 and the image of the first light source 3000.1 are imaged by a second collector optic 3002.2 into a third light source 3000.3. In the example shown the third light source 3000.3 and the images of the first and the second light sources 3000.1, 3000.2 are imaged by a third collector unit 3002.3 into a light source image 3008. The light source image 3008 is then a superposition of an image of the first, second and third light sources 3000.1, 3000.2, 3000.3.

The light intensity of the light source image 3008 is then approximately three times of the intensity of a single light source, in case each of the three light sources have the same intensity, reduced, however, by the transmission of the nested collectors.

It should be understood that various alternatives and modifications of the present invention can be devised by those skilled in the art. The present invention is intended to embrace all such alternatives, modifications and variances that fall within the scope of the appended claims.

The invention claimed is:

1. An illumination system, comprising:
   a first light source and a second light source, each of which are for providing light having a wavelength ≦193 nm; and
   an optical element having a plurality of raster elements that includes at least three raster elements,
   wherein said first light source illuminates a first area of said optical element and said second light source illuminates a second area of said optical element, and
   wherein said light that impinges on said optical element is reflected by said optical element.

2. The illumination system of claim 1, wherein said plurality of raster elements partitions light from said first light source and said second light source into a plurality of light channels.

3. The illumination system of claim 1, wherein said first area and said second area are spatially separated from one another.

4. The illumination system of claim 1, wherein said first area includes a first subset of said plurality of raster elements, and said second area includes a second subset of said plurality of raster elements.

5. The illumination system of claim 1, wherein said first light source comprises a first collecting optical element.

6. The illumination system of claim 5, wherein said second light source comprises a second collecting optical element.

7. The illumination system of claim 5,
   wherein said plurality of raster elements includes a first subset of said plurality of raster elements in said first area, and
   wherein said first subset of said plurality of raster elements receives light from said first collecting optical element.

8. The illumination system of claim 7,
   wherein said second light source includes a second collecting optical element,
   wherein said plurality of raster elements includes a second subset of said plurality of raster elements in said second area, and
   wherein said second subset of said plurality of raster elements receives light from said second collecting optical element.

9. The illumination system of claim 1, wherein said optical element is a first optical element, and said plurality of raster elements is a first plurality of raster elements, and
   wherein said illumination system further comprises a second optical element with a second plurality of raster elements for receiving said plurality of light channels from said first plurality of raster elements.

10. The illumination system of claim 9,
wherein said first area includes a first subset of said first plurality of raster elements for partitioning light from said first light source into a plurality of light channels,
wherein said second plurality of raster elements receives said plurality of light channels such that a member of said first plurality raster elements and a member of said second plurality of raster elements are each assigned to a member of said plurality of light channels, and
wherein said plurality of light channels is configured to provide an illumination pattern in an exit pupil of said illumination system.

11. The illumination system of claim 10, wherein said illumination pattern is in a shape selected from the group consisting of a circular shape and an annular shape.

12. The illumination system of claim 10,
wherein said plurality of light channels is a first plurality of light channels, and said illumination pattern is a first illumination pattern,
wherein said second area includes a second subset of said first plurality of raster elements for partitioning light from said second light source into a second plurality of light channels,
wherein said second plurality of raster elements receives said first plurality of light channels in a first subset of said second plurality of raster elements, and receives said second plurality of light channels in a second subset of said second plurality of raster elements, such that a member of said second subset of said first plurality of raster elements and a member of said second subset of said second plurality of raster elements are each assigned to a member of said second plurality of light channels, and
wherein said second plurality of light channels is configured to provide a second illumination pattern in said exit pupil.

13. The illumination system of claim 12, wherein said second illumination pattern is in a shape selected from the group consisting of a circular shape and an annular shape.

14. The illumination system of claim 12, wherein said first illumination pattern has a shape that is different from that of said second illumination pattern.

15. The illumination system of claim 1, wherein said first light source comprises a spectral filter.

16. The illumination system of claim 15, wherein said second light source comprises a spectral filter.

17. The illumination system of claim 1, wherein said first light source comprises a reflecting optical element.

18. The illumination system of claim 17, wherein said second light source comprises a reflecting optical element.

19. The illumination system of claim 1,
wherein said first light source includes a first collector for collecting first light from a light emitter and focusing said first light to a first focus point,
wherein said second light source includes a second collector for collecting second light from a light emitter and focusing said second light to a second focus point, and
wherein said first focus point is at a position that is substantially identical to that of said second focus point.

20. The illumination system of claim 19, wherein said first area and said second area are spatially separated from one another.

21. The illumination system of claim 19, wherein said first area comprises a first plurality of first raster elements and said second area comprises a second plurality of first raster elements.

22. The illumination system of claim 19, wherein said plurality of raster elements includes a first subset of said plurality of raster elements in said first area, in an arrangement adapted to said first collecting optical element.

23. The illumination system of claim 22, wherein said plurality of raster elements includes a second subset of said plurality of raster elements in said second area, in an arrangement adapted to said second collecting optical element.

24. The illumination system of claim 19,
wherein said optical element is a first optical element, and said plurality of raster elements is a first plurality of raster elements, and
wherein said illumination system further comprises a second optical element with a second plurality of raster elements for receiving said plurality of light channels from said first plurality of raster elements.

25. The illumination system of claim 24,
wherein said first area includes a first subset of said first plurality of raster elements for partitioning light from said first light source into a plurality of light channels,
wherein said second plurality of raster elements receives said plurality of light channels, such that a member of said first plurality raster elements and a member of said second plurality of raster elements are each assigned to a member of said plurality of light channels, and
wherein said plurality of light channels is configured to provide an illumination pattern in an exit pupil of said illumination system.

26. The illumination system of claim 25, wherein said illumination pattern is in a shape selected from the group consisting of a circular shape and an annular shape.

27. The illumination system of claim 25,
wherein said plurality of light channels is a first plurality of light channels, and said illumination pattern is a first illumination pattern,
wherein said second area includes a second subset of said first plurality of raster elements for partitioning light from said second light source into a second plurality of light channels,
wherein said second plurality of raster elements receives said first plurality of light channels in a first subset of said second plurality of raster elements, and receives said second plurality of light channels in a second subset of said second plurality of raster elements, such that a member of said second subset of said first plurality of raster elements and a member of said second subset of said second plurality of raster elements are each assigned to a member of said second plurality of light channels, and
wherein said second plurality of light channels is configured to provide a second illumination pattern in said exit pupil.

28. The illumination system of claim 27, wherein said second illumination pattern is in a shape selected from the group consisting of a circular shape and an annular shape.

29. The illumination system of claim 27, wherein said first illumination pattern has a shape that is different from that of said second illumination pattern.

30. The illumination system of claim 19, wherein said first collecting optical element has a shape selected from the group consisting of a cylindrical shape and an elliptic shape.

31. The illumination system of claim 30, wherein said second collecting optical element has a shape selected from the group consisting of a cylindrical shape and an elliptic shape.

32. An projection exposure apparatus, comprising:
a plane for accommodating a mask;
the illumination system of claim 1, for illuminating said mask;
a carrier system for accommodating a light-sensitive object; and
a projection objective lens for imaging said mask on said light-sensitive object.

33. A light source device comprising:
a first light source for emitting a first light bundle having a wavelength $\leq 193$ nm
a second light source for emitting a second light bundle having a wavelength $\leq 193$ nm; and
an optical unit having a first plurality of raster elements that includes at least three raster elements, for reflecting said first and second light bundles to produce a combined light bundle.

34. The light source device of claim 33, further comprising an optical element having a second plurality of raster elements for focusing one of said first and second light bundles onto said optical unit.

35. The light source device of claim 34,
wherein said combined light bundle is directed to an optical device for illuminating a filed in an image plane,
wherein said optical device includes a third plurality of raster elements, and
wherein said first, second and third plurality of raster elements each contain the same number of raster elements.

36. A projection exposure apparatus, comprising:
a plane for accommodating a mask;
an illumination system that includes (a) a first light source for emitting a first light bundle having a wavelength $\leq 193$ nm, (b) a second light source for emitting a second light bundle having a wavelength $\leq 193$ nm, and (c) an optical unit having at least three raster elements, for reflecting said first and second light bundles to produce a combined light bundle for illuminating said mask;
a carrier system for accommodating a light-sensitive object; and
a projection objective lens for imaging said mask on said light sensitive object.

37. The projection exposure apparatus of claim 36,
wherein said first light source is operated under a first operating condition and said second light source is operated under a second operating condition, and wherein said first operating condition is different from said second operating condition.

38. The projection exposure apparatus of claim 36,
wherein said first light bundle includes a first light beam, and said second light bundle includes a second light beam, and
wherein said first and said second light beams are incoherently superimposed to reduce a degree of coherence of said illumination system.

39. A method comprising:
reflecting a first light bundle having a wavelength $\leq 193$ nm, and a second light bundle having a wavelength $\leq 193$ nm, by an optical component having at least three raster elements, to produce a combined light bundle;
illuminating a mask with said combined light bundle; and
imaging said mask onto a light sensitive object to produce a microelectronic component.

40. A projection exposure apparatus, comprising:
a first light source for emitting a first light bundle having a wavelength $\leq 193$ nm;
a second light source for emitting a second light bundle having a wavelength $\leq 193$ nm; and
an optical element having at least three raster lelments, for collecting, condensing and reflecting said first and second light bundles to produce a combined light bundle to illuminate a reticle in an area to expose a pattern on a substrate.

41. A projection exposure apparatus, comprising:
a first light source for emitting light having a first wavelength $\leq 193$ nm;
a second light source emitting light having a second wavelength $\leq 193$ nm; and
an optical unit having at least three raster elements, for reflecting said light from said first and second light sources, to produce a combined light bundle,
wherein said first wavelength is different from said second wavelength.

* * * * *